(12) United States Patent
Kim

(10) Patent No.: US 11,568,928 B2
(45) Date of Patent: Jan. 31, 2023

(54) ELECTRONIC DEVICE

(71) Applicant: SK hynix Inc., Icheon (KR)

(72) Inventor: Hwang Yeon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/220,811

(22) Filed: Apr. 1, 2021

(65) Prior Publication Data

US 2022/0208263 A1 Jun. 30, 2022

(30) Foreign Application Priority Data

Dec. 28, 2020 (KR) .................. 10-2020-0184447

(51) Int. Cl.
*G11C 13/00* (2006.01)
*H01L 45/00* (2006.01)
*H01L 27/24* (2006.01)

(52) U.S. Cl.
CPC .......... *G11C 13/0021* (2013.01); *H01L 27/24* (2013.01); *H01L 45/14* (2013.01)

(58) Field of Classification Search
None
See application file for complete search history.

(56) References Cited

U.S. PATENT DOCUMENTS

| | | | | |
|---|---|---|---|---|
| 11,264,290 | B2 * | 3/2022 | Sasaki | H01L 43/02 |
| 2016/0049447 | A1 * | 2/2016 | Jung | H01L 27/2418 |
| | | | | 257/4 |
| 2019/0043923 | A1 * | 2/2019 | Ahmed | H01L 27/2427 |
| 2020/0111835 | A1 * | 4/2020 | Cho | H01L 45/1253 |
| 2020/0126991 | A1 * | 4/2020 | Yamazaki | G11C 11/4097 |
| 2020/0136039 | A1 * | 4/2020 | Tsai | H01L 45/08 |
| 2020/0350497 | A1 * | 11/2020 | Yoon | H01L 45/145 |
| 2021/0028107 | A1 * | 1/2021 | Yang | H01L 23/5226 |
| 2021/0091083 | A1 * | 3/2021 | Kato | H01L 29/24 |
| 2021/0328037 | A1 * | 10/2021 | Yamazaki | H01L 29/7869 |
| 2021/0384326 | A1 * | 12/2021 | Yamazaki | H01L 21/02178 |
| 2022/0037534 | A1 * | 2/2022 | Yamazaki | H01L 27/1225 |

FOREIGN PATENT DOCUMENTS

KR 1020200039887 A 4/2020

* cited by examiner

*Primary Examiner* — Michael T Tran

(57) ABSTRACT

A semiconductor memory includes a substrate including a cell region, a first peripheral circuit region, and a second peripheral circuit region; a plurality of first lines disposed over the substrate across the cell region and the first peripheral circuit region; a plurality of second lines disposed over the first lines across the cell region and the second peripheral circuit region; and a first memory cell positioned at each of intersections between the first lines and the second lines, wherein the cell region includes a first cell region and a second cell region, the first cell region being disposed closer to the first and second peripheral circuit regions than the second cell region, and wherein a first portion of the second line that is in the first cell region has a greater resistance than a second portion of the second line that is in the second cell region.

11 Claims, 22 Drawing Sheets

ELECTRONIC DEVICE

CROSS-REFERENCE TO RELATED APPLICATION

This application claims priority under 35 U.S.C. §119 to Korean Patent Application No. 10-2020-0184447 filed on Dec. 28, 2020, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistance states according to an applied voltage or current. Such semiconductor devices include, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in the present disclosure includes various embodiments of an electronic device capable of improving operating characteristics of a semiconductor memory and simplifying manufacturing processes thereof.

In an embodiment, an electronic device includes a semiconductor memory, which includes: a substrate including a cell region, a first peripheral circuit region disposed at one side of the cell region in a first direction, and a second peripheral circuit region disposed at one side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; and a first memory cell positioned at each of intersections between the first lines and the second lines in the cell region, wherein the cell region includes a first cell region and a second cell region, the first cell region being disposed closer to the first and second peripheral circuit regions than the second cell region, and wherein a first portion of the second line that is in the first cell region has a greater resistance than a second portion of the second line that is in the second cell region.

In another embodiment, an electronic device includes a semiconductor memory, which includes: a substrate including a cell region, a first peripheral circuit region disposed at one side of the cell region in a first direction, and a second peripheral circuit region disposed at one side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a first memory cell positioned at each of intersections between the first lines and the second lines in the cell region; a plurality of third lines disposed over the second lines and respectively overlapping and contacting the second lines; a plurality of fourth lines disposed over the third lines and respectively overlapping the first lines; and a second memory cell positioned at each of intersections between the third lines and the fourth lines in the cell region, wherein the cell region includes a first cell region and a second cell region, the first cell region being disposed closer to the first and second peripheral circuit regions than the second cell region, and wherein a first portion of the second line that is in the first cell region has a greater resistance than the third line.

DETAILED DESCRIPTION

Figure 1:
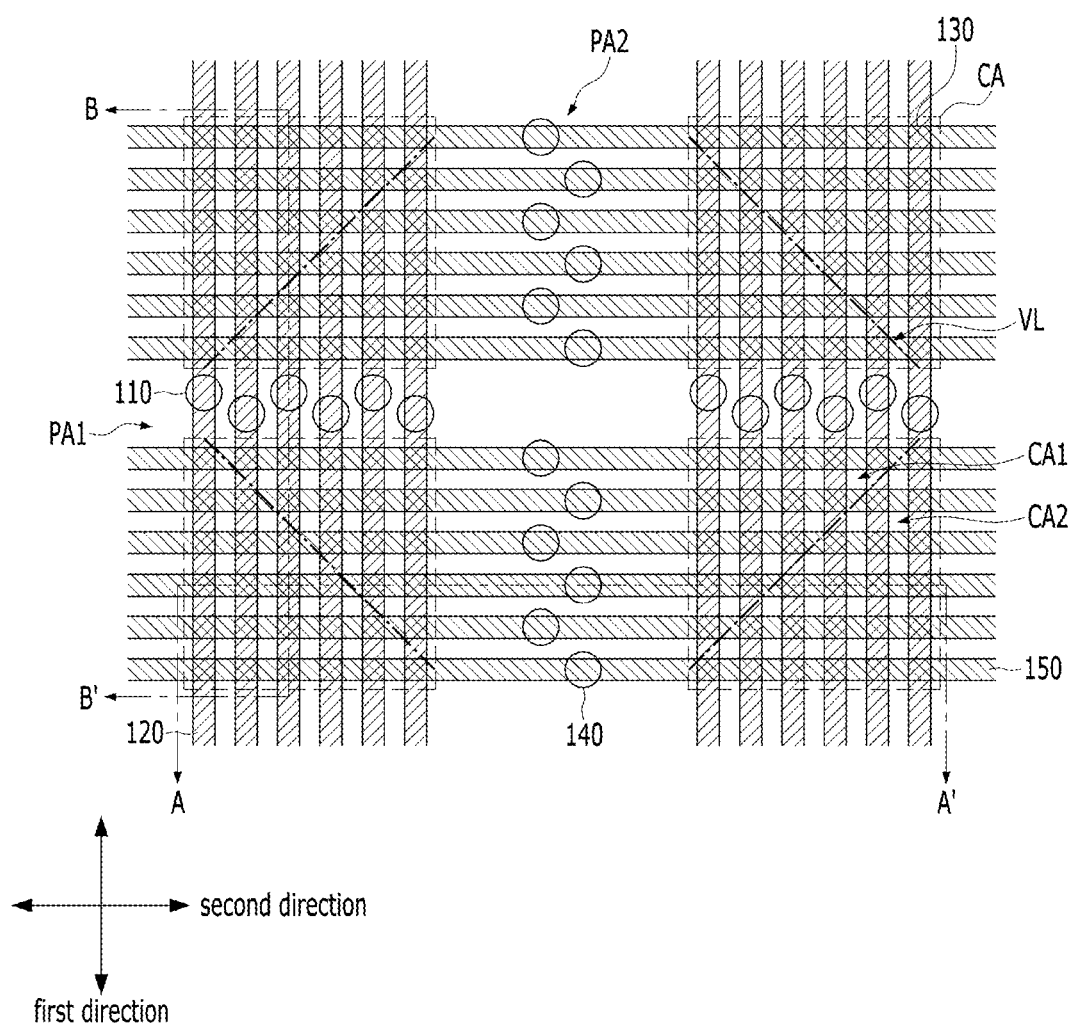
FIG. 1 is a plan view illustrating a memory device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2A:
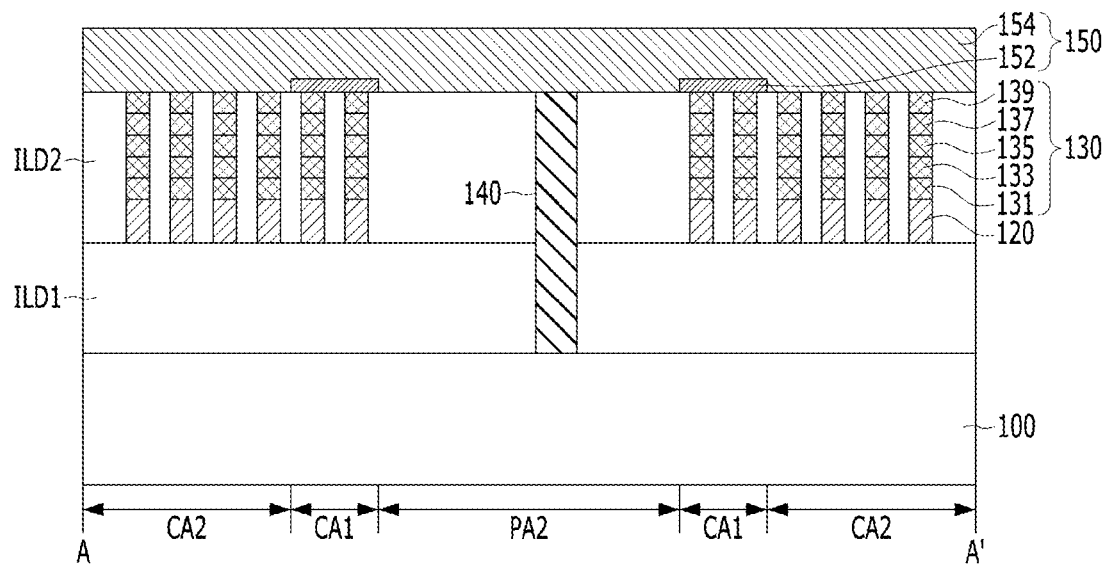
FIG. 2A is a cross-sectional view taken along a line A-A' of FIG. 1.
Figure 2B:
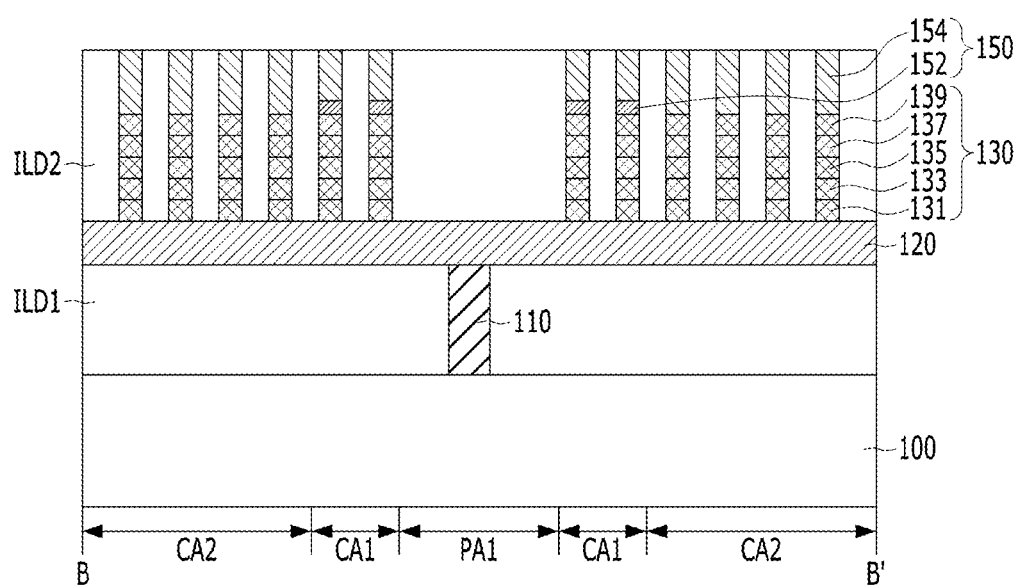
FIG. 2B is a cross-sectional view taken along a line B-B' of FIG. 1.

FIG. 1 is a plan view illustrating a memory device according to an embodiment of the present disclosure, FIG. 2A is a cross-sectional view taken along a line A-A' of FIG. 1, and FIG. 2B is a cross-sectional view taken along a line B-B' of FIG. 1.

Referring to FIGS. 1, 2A, and 2B, the memory device may include a substrate 100, first lines 120 disposed over the substrate 100 and extending in a first direction, second lines 150 disposed over the first lines 120 and extending in a second direction crossing the first direction, and a memory cell 130 positioned at each of intersections between the first lines 120 and the second lines 150.

The substrate 100 may include a semiconductor material such as silicon. In addition, the substrate 100 may include a cell region CA and peripheral circuit regions PA1 and PA2 in a plane defined by the first and second directions. The cell region CA may be a region in which the memory cells 130 are disposed, and the peripheral circuit regions PA1 and PA2 may be regions in which driving circuits (not shown) for driving the memory cells 130 are disposed. While the memory cells 130 are disposed over a portion of the substrate 100 that belongs to the cell region CA, the driving circuits may be formed in portions of the substrate 100 that belong to the peripheral circuit regions PA1 and PA2.

In the present embodiment, in a plan view, the cell region CA may have a rectangular shape, and four cell regions CA may be arranged to be spaced apart from each other in a 2*2 matrix shape along the first and second directions. In addition, in a plan view, the peripheral circuit regions PA1 and PA2 may be positioned between these four cell regions CA, and may have a cross shape or a lattice shape. However, embodiments are not limited thereto, and the number and arrangement of the cell regions CA and the peripheral circuit regions PA1 and PA2 may be variously modified according to embodiments.

For convenience of description, among the peripheral circuit regions PA1 and PA2, a region extending in the second direction while being positioned between every two cell regions CA arranged in the first direction among the four cell regions CA will be referred to as a first peripheral circuit region PA1, and a region extending in the first direction while being positioned between every two cell regions CA arranged in the second direction among the four cell regions CA will be referred to as a second peripheral circuit region PA2.

Meanwhile, the cell region CA may include a first cell region CA1 relatively close to the peripheral circuit regions PA1 and PA2, and a second cell region CA2 relatively far from the peripheral circuit regions PA1 and PA2. Accordingly, an electrical path between the memory cell 130 in the first cell region CA1 and the driving circuit in the peripheral circuit regions PA1 and PA2 may be shorter than an electrical path between the memory cell 130 in the second cell region CA2 and the driving circuit in the peripheral circuit regions PA1 and PA2. For example, a virtual boundary line VL separating the first cell region CA1 from the second cell region CA2 may extend in a diagonal direction crossing the first direction and the second direction. However, embodiments are not limited thereto, and the virtual boundary line VL may be variously determined in consideration of a distance between the memory cell 130 and the peripheral circuit regions PA1 and PA2.

The first lines 120 may extend in the first direction across the two cell regions CA and the first peripheral circuit region PA1. The first lines 120 may function as word lines or bit lines. The first lines 120 may be electrically connected to a portion of the substrate 100 through first contact plugs 110, the portion of the substrate 100 belonging to the first peripheral circuit region PA1 in which the driving circuit is disposed, the first contact plugs 110 being disposed in the first peripheral circuit region PA1 and respectively connected to the first lines 120. The first contact plugs 110 may be formed to penetrate a first interlayer insulating layer ILD1 between the first lines 120 and the substrate 100. The first interlayer insulating layer ILD1 may include one of various insulating materials, such as silicon oxide, silicon nitride, or a combination thereof. Each of the first lines 120 and the first contact plugs 110 may include one of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof.

In the present embodiment, the first lines 120 and the first contact plugs 110 may be connected in one-to-one correspondence. In addition, the first contact plugs 110 may be arranged in a zigzag shape along the second direction in a plan view. This is to secure a gap between two neighboring first contact plugs 110 in the second direction. However, embodiments are not limited thereto, and the number and arrangement of the first lines 120 and the first contact plugs 110 may be variously modified according to embodiments.

The second lines 150 may extend in the second direction across the two cell regions CA and the second peripheral circuit region PA2. When the first lines 120 function as word lines, the second lines 150 may function as bit lines. Alternatively, when the first lines 120 function as bit lines, the second lines 150 may function as word lines. The second lines 150 may be electrically connected to a portion of the substrate 100 through second contact plugs 140, the portion of the substrate 100 belonging to the second peripheral circuit region PA2 in which the driving circuit is disposed, the second contact plugs 140 being disposed in the second peripheral circuit region PA2 and respectively connected to the second lines 150. The second contact plugs 140 may be formed to penetrate the first interlayer insulating layer ILD1 and a second interlayer insulating layer ILD2 disposed between the second lines 150 and the substrate 100. The second interlayer insulating layer ILD2 is disposed on the first interlayer insulating layer ILD1.

The second interlayer insulating layer ILD2 may include one of various insulating materials, such as silicon oxide, silicon nitride, or a combination thereof. Each of the second lines 150 and the second contact plugs 140 may include one of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. In the present embodiment, the second lines 150 and the second contact plugs 140 may be connected in one-to-one correspondence. In addition, the second contact plugs 140 may be arranged in a zigzag shape along the first direction in a plan view. This is to secure a gap between two neighboring second contact plugs 140 in the first direction. However, embodiments are not limited thereto, and the number and arrangement of the second lines 150 and the second contact plugs 140 may be variously modified according to embodiments.

In an embodiment, a first portion of the second line 150 that is in the first cell region CA1 may have a greater resistance than a second portion of the second line 150 that is in the second cell region CA2. To this end, the first portion and the second portion of the second line 150 may have different layered-structures and/or materials. For example, the first portion of the second line 150 in the first cell region CA1 may include a double layered-structure in which a material layer 152 and a conductive layer 154 are stacked, and the second portion of the second line 150 in the second cell region CA2 may include a single layered-structure of the conductive layer 154.

The conductive layer 154 may include a conductive material having a relatively low resistance, such as a metal or a metal nitride. The material layer 152 may include a material having a higher resistance than the conductive layer 154. The material layer 152 may include a conductive material having a higher resistance than the conductive layer 154, or may include an insulating material having a thickness of several to tens of A to allow current to flow between the conductive layer 154 and the memory cell 130.

For example, the material layer 152 may include titanium nitride (TiN), and the conductive layer 154 may include tungsten (W). Alternatively, the material layer 152 may include tungsten silicon nitride (WSiN), and the conductive layer 154 may include tungsten (W).

In addition, the second line 150 may have a substantially constant height in the first cell region CA1 and the second cell region CA2. Accordingly, the sum of the thickness of the material layer 152 and a thickness of the conductive layer 154 in the first cell region CA1 may be substantially the same as the thickness of the conductive layer 154 in the second cell region CA2. Furthermore, the thickness of the material layer 152 may be smaller than the thickness of the conductive layer 154 in the first cell region CA1. Accordingly, most of the second line 150 may be occupied by the conductive layer 154.

The memory cells 130 may be arranged in the cell region CA by being located at the intersections between the first lines 120 and the second lines 150. Data stored in the memory cell 130 may be changed according to a voltage or current applied to the first line 120 and the second line 150. For example, the memory cell 130 may include a variable resistance element that stores different data by switching between different resistance states according to a voltage or current applied to the first line 120 and the second line 150.

In an embodiment, the memory cell 130 may include a multi-layered structure including a lower electrode layer 131, a selection element layer 133, an intermediate electrode layer 135, a variable resistance layer 137, and an upper electrode layer 139.

The lower electrode layer 131 and the upper electrode layer 139 may be positioned at lower and upper ends of the memory cell 130, respectively, and may function to transmit a voltage or current required for an operation of the memory cell 130. The intermediate electrode layer 135 may function to electrically connect the selection element layer 133 and the variable resistance layer 137 while physically separating them from each other. The lower electrode layer 131, the intermediate electrode layer 135, or the upper electrode layer 139 may include one of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the lower electrode layer 131, the intermediate electrode layer 135, or the upper electrode layer 139 may include a carbon electrode.

The selection element layer 133 may function to prevent a current leakage that may occur between the memory cells 130 sharing the first line 120 or the second line 150. To this end, the selection element layer 133 may have a threshold switching characteristic, that is, a characteristic for blocking or substantially limiting current flowing in the selection element layer 133 when a magnitude of an applied voltage is less than a predetermined threshold value and for allowing the current to abruptly increase when the magnitude of the applied voltage exceeds the threshold value. The threshold value may be referred to as a threshold voltage, and the selection element layer 133 may be implemented in a turn-on state or a turn-off state based on the threshold voltage. The selection element layer 133 may include a diode, an OTS (Ovonic Threshold Switching) material such as a chalcogenide material, an MIEC (Mixed Ionic Electronic Conducting) material such as a metal containing a chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The variable resistance layer 137 may be an element that stores data in the memory cell 130. To this end, the variable resistance layer 137 may have a variable resistance characteristic of switching between different resistance states according to an applied voltage. The variable resistance layer 137 may have a single-layered structure or a multi-layered structure including at least one of materials used for an RRAM, a PRAM, an MRAM, an FRAM, and the like. The materials may include a metal oxide such as a perovskite-based oxide, a transition metal oxide, or the like, and a phase change material such as a chalcogenide-based material, a ferromagnetic material, a ferroelectric material, or the like.

However, the layered-structure of the memory cell 130 is not limited thereto. When the memory cell 130 is a variable resistance device and as long as it includes the variable resistance layer 137 essential for data storage, a stacking order of the layers included in the memory cell 130 may be changed or at least one of the layers included in the memory cell 130 may be omitted. For example, at least one of the lower electrode layer 131, the selection element layer 133, the intermediate electrode layer 135, and the upper electrode layer 139 may be omitted. The positions of the selection element layer 133 and the variable resistance layer 137 may be reversed. One or more layers (not shown) may be added to the memory cell 130 to improve fabricating processes or characteristics of the memory cell 130.

The effects of the memory device described above with reference to FIGS. 1 to 2B will be described in comparison with a comparative example as follows.

In a memory device of the comparative example, upper and lower lines respectively located over and under a memory cell may have the same structure regardless of a distance between the memory cell and a peripheral circuit region. In this comparative example, in order to drive a memory cell relatively far from the peripheral circuit region, it may be necessary to lower resistances of the upper and lower lines or to supply a large amount of current through the upper and lower lines. However, there may be a limit to lowering the resistances of the upper and lower lines. In addition, when a large amount of current is supplied through the upper and lower lines, excessive overshooting current or spike current may flow through a memory cell relatively close to the peripheral circuit region, resulting in operation failure of the memory cell.

However, as in the present embodiment, when the second line 150 includes the double-layered structure of the material layer 152 having the higher resistance and the conductive layer 154 having the lower resistance in the first cell region CA1, and includes the single-layered structure of the conductive layer 154 in the second cell region CA2, the above problem of the comparative example may be solved. Specifically, because the voltage/current is applied to the memory cell 130 through the conductive layer 154 that occupies most of the second line 150 and has the lower resistance, the memory cells 130 in the first and second cell regions CA1 and CA2 may be easily driven. In addition, in the first cell region CA1, the material layer 152 having the higher resistance may be inserted between the conductive layer 154 and the memory cell 130, and thus, it may be possible to prevent excessive current from flowing through the memory cell 130 in the first cell region CA1.

Further, as shown in the description of a fabricating method to be described later, a process of forming the second line 150 may be completely separated from and performed after a process of forming the memory cell 130. Accordingly, it may be possible to only prevent excessive current from flowing in the memory cell 130 disposed in the first cell region CA1 without damaging the memory cell 130 or changing the characteristics of the memory cell 130 during the fabricating processes. In addition, the fabricating processes may be easy and simple by simply changing the process of forming the second line 150 without changing the process of forming the memory cell 130.

FIGS. 3A to 8B are cross-sectional views illustrating a method of fabricating the memory device shown in FIGS. 1, 2A, and 2B according to an embodiment. FIGS. 3A, 4A, 5A, 6A, 7A, and 8A are shown based on a cross section taken along the line A-A' of FIG. 1, and FIGS. 3B, 4B, 5B, 6B, 7B, and 8B are shown based on a cross section taken along the line B-B' of FIG. 1.

Figure 3A:
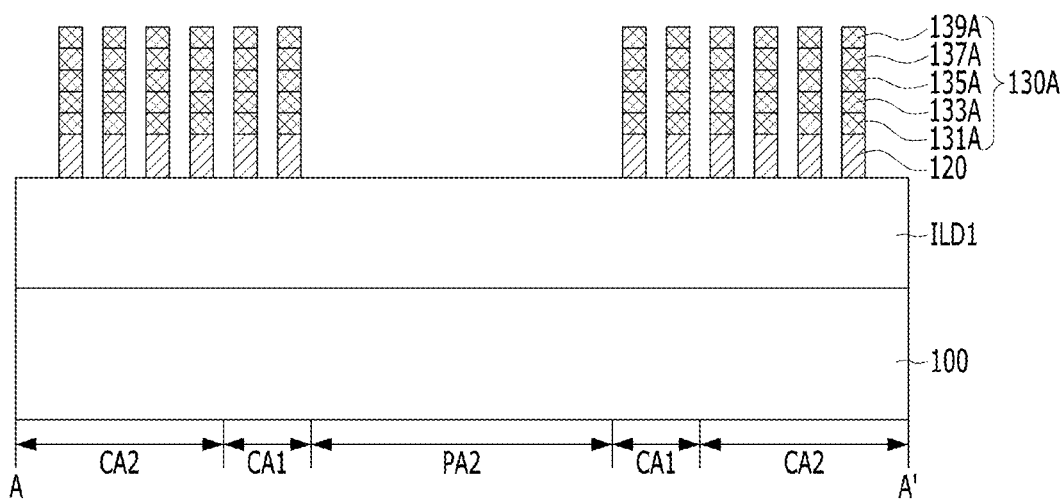
FIGS. 3A, 4A, 5A, 6A, 7A, and 8A are cross-sectional views taken along the line A-A' of FIG. 1, and FIGS. 3B, 4B, 5B, 6B, 7B, and 8B are cross-sectional views taken along the line B-B' of FIG. 1, according to an embodiment of the present disclosure.
Figure 3B:
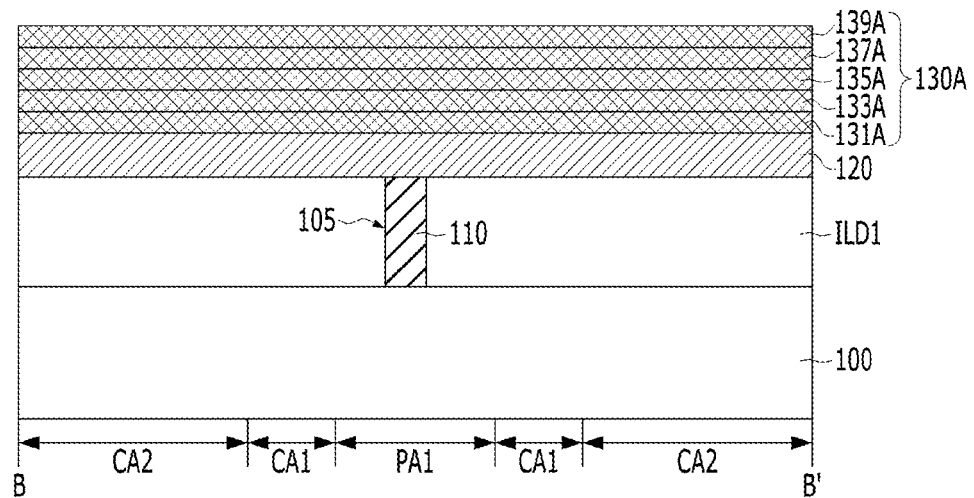

Referring to FIGS. 3A and 3B, a first interlayer insulating layer ILD1 may be formed over a substrate 100 that includes a first cell region CA1, a second cell region CA2, a first peripheral circuit region PA1, and a second peripheral circuit region PA2.

Subsequently, a first contact hole 105 exposing a part of the substrate 100 may be formed by selectively etching the first interlayer insulating layer ILD1 in the first peripheral circuit region PA1. Then, a first contact plug 110 may be formed by depositing a conductive material to fill the first contact hole 105, and performing a planarization process on the deposited conductive material until an upper surface of the first interlayer insulating layer ILD1 is exposed. The planarization process may use CMP (Chemical Mechanical Polishing).

Subsequently, a stacked structure of a first line 120 and an initial memory cell 130A may be formed over the first interlayer insulating layer ILD1 in which the first contact plug 110 is formed. The stacked structure of the first line 120 and the initial memory cell 130A may be formed by depositing a conductive layer for forming the first line 120 and material layers for forming the initial memory cell 130A, and etching the conductive layer and the material layers using a mask pattern (not shown) having a line shape extending in a first direction as an etching barrier. Accordingly, the first line 120 may have a line shape extending in the first direction while overlapping and being connected with the first contact plug 110, and the initial memory cell 130A may have a line shape extending in the first direction while overlapping the first line 120. The initial memory cell 130A may include a stacked structure of an initial lower electrode layer 131A, an initial selection element layer 133A, an initial intermediate electrode layer 135A, an initial variable resistance layer 137A, and an initial upper electrode layer 139A.

Figure 4A:
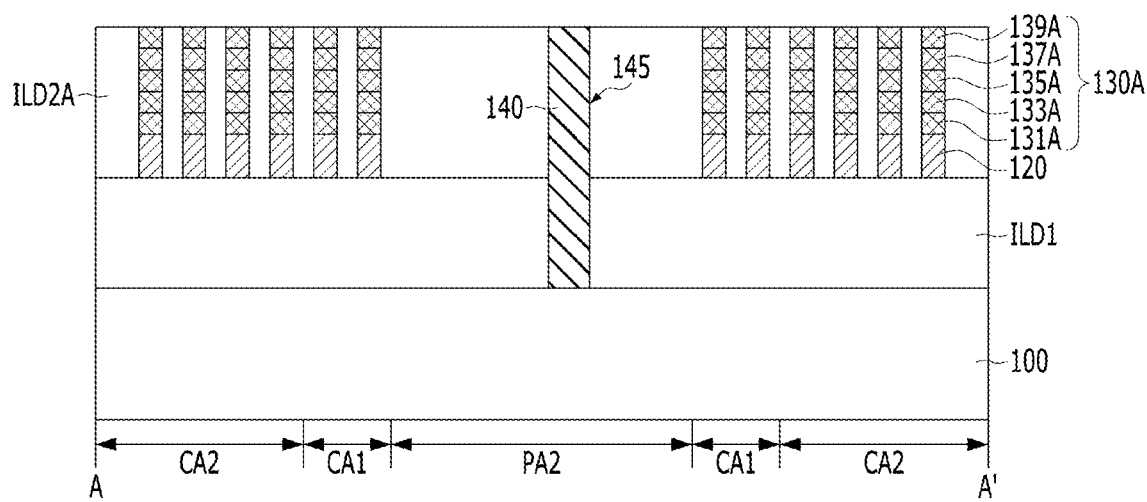
Figure 4B:
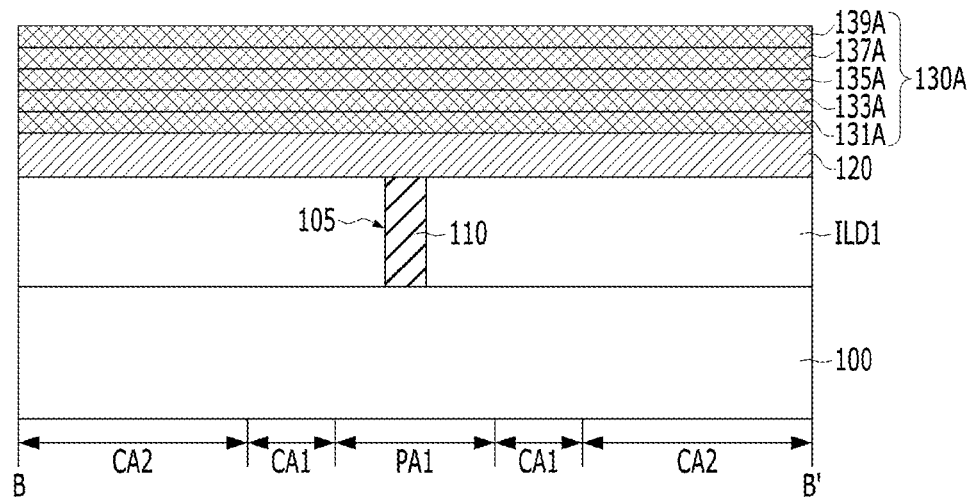

Referring to FIGS. 4A and 4B, an initial second interlayer insulating layer ILD2A may be formed over the first interlayer insulating layer ILD1 to fill spaces between the stacked structures of the first line 120 and the initial memory cell 130A. The initial second interlayer insulating layer ILD2A may be formed by depositing an insulating material to cover the initial memory cell 130A, and performing a planarization process on the deposited insulating material until an upper surface of the initial memory cell 130A is exposed.

Subsequently, a second contact hole 145 exposing a part of the substrate 100 may be formed by selectively etching the initial second interlayer insulating layer ILD2A and the first interlayer insulating layer ILD1 in the second peripheral circuit region PA2. Then, a second contact plug 140 filling the second contact hole 145 may be formed.

Figure 5A:
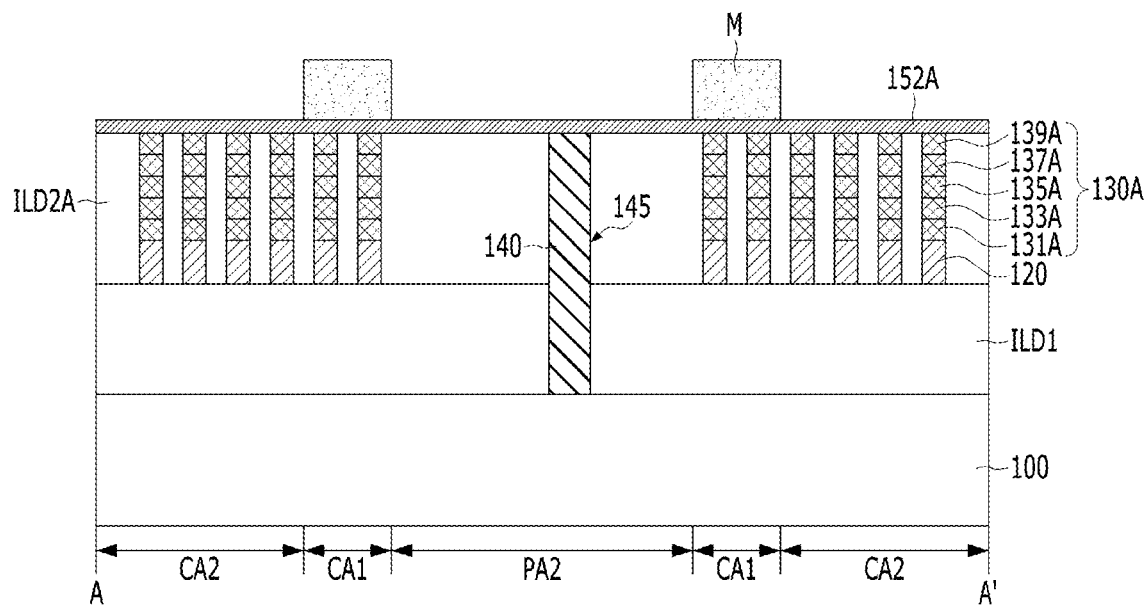
Figure 5B:
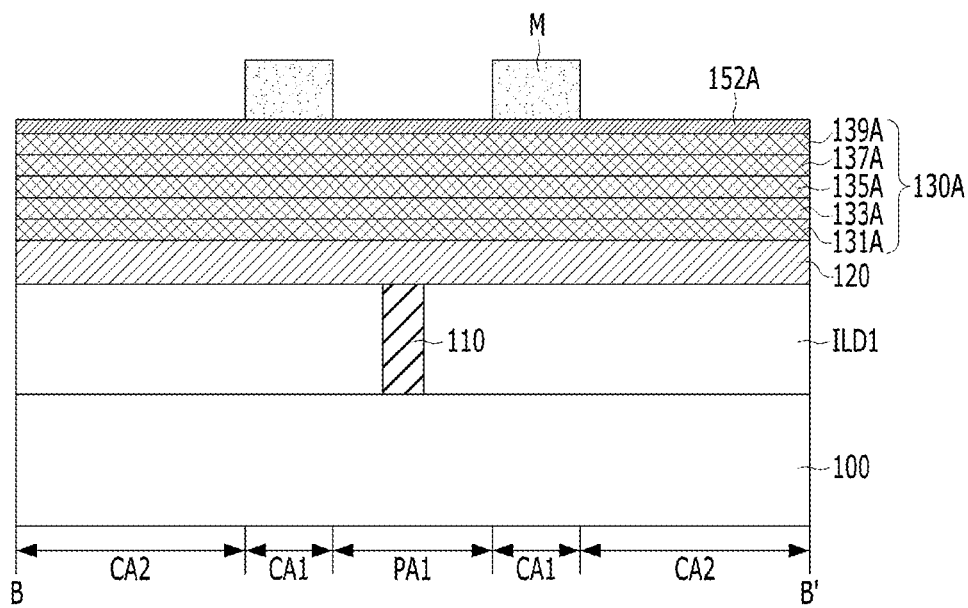

Referring to FIGS. 5A and 5B, an initial material layer 152A may be formed over a resultant structure of FIGS. 4A and 4B. The initial material layer 152A may be formed by depositing a conductive layer or an insulating layer having a relatively small thickness using physical vapor deposition (PVD), chemical vapor deposition (CVD), or the like.

Subsequently, a mask pattern M may be formed over the initial material layer 152A to cover the first cell region CA1 and open the second cell region CA2. In the present embodiment, the mask pattern M may also open the peripheral circuit regions PA1 and PA2. However, embodiments are not limited thereto. In another embodiment, the peripheral circuit regions PA1 and PA2 may be partially or fully covered by the mask pattern M.

Figure 6A:
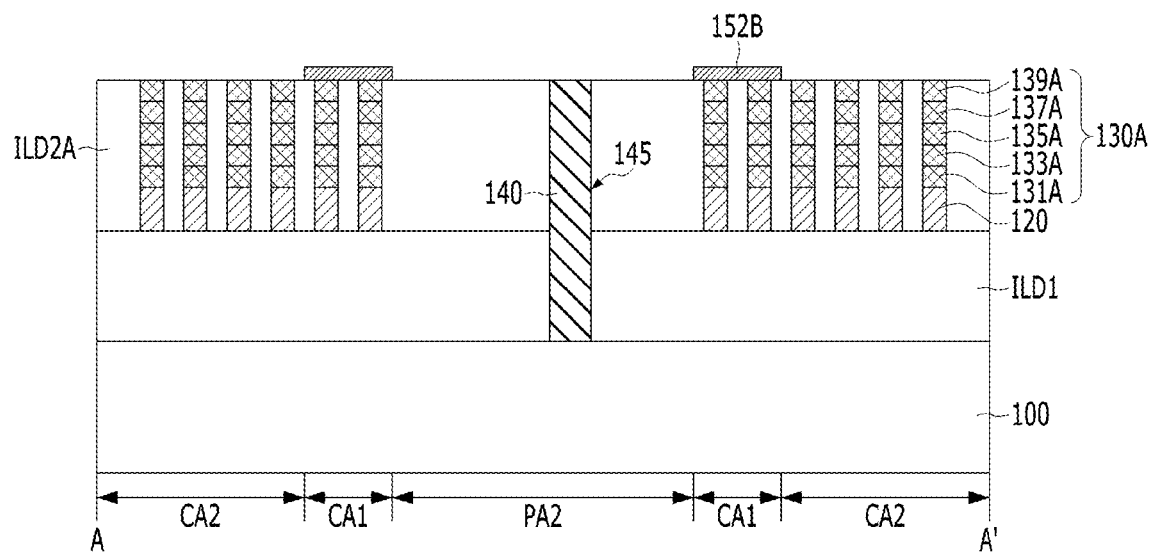
Figure 6B:
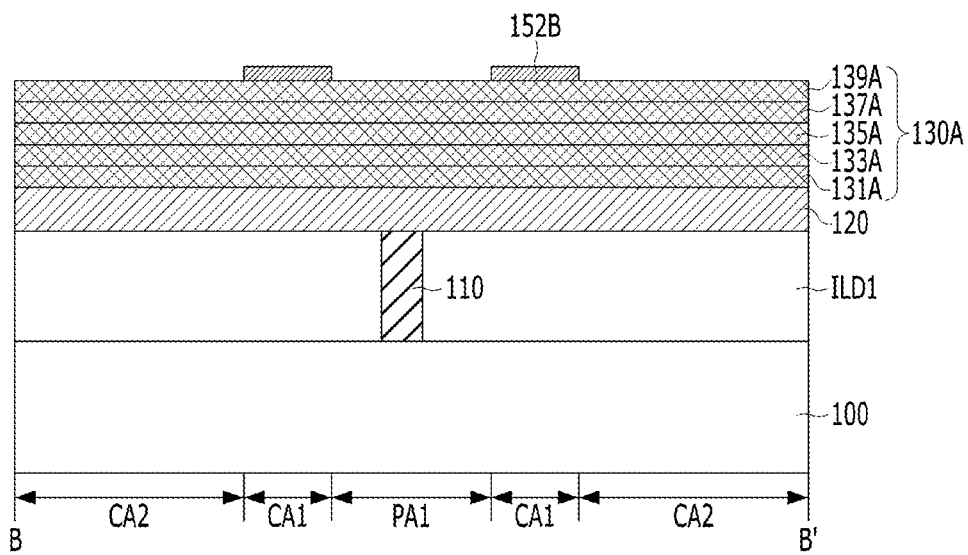

Referring to FIGS. 6A and 6B, an intermediate material layer 152B may be formed by etching the initial material layer 152A using the mask pattern M as an etching barrier. As a result of this process, the intermediate material layer 152B may exist only in the first cell region CA1 and may not exist in the second cell region CA2. That is, the intermediate material layer 152B may have a shape overlapping the first cell region CA1.

Subsequently, the mask pattern M may be removed.

Figure 7A:
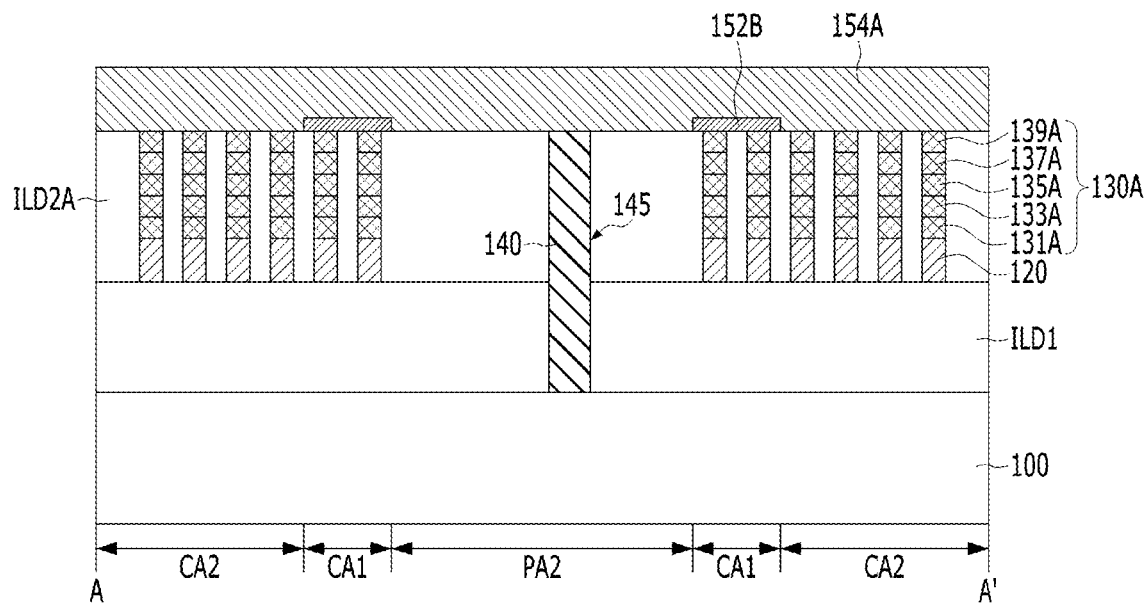
Figure 7B:
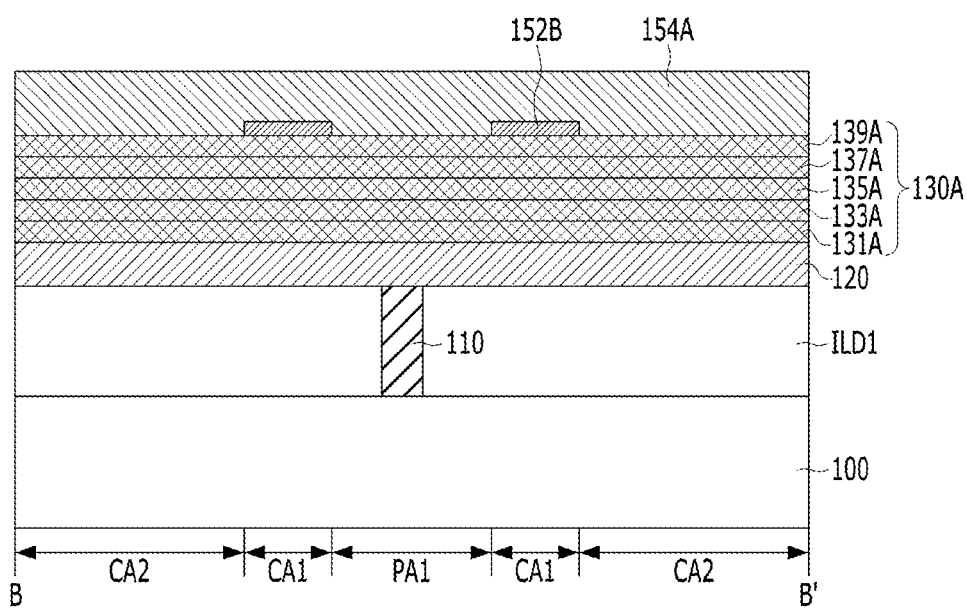

Referring to FIGS. 7A and 7B, an initial conductive layer 154A may be formed over a resultant structure of FIGS. 6A and 6B by deposition or the like.

The initial conductive layer 154A may be formed to have a planarized upper surface. If the initial conductive layer 154A does not have the planarized upper surface after the deposition of the initial conductive layer 154A, for example, if an upper surface of a portion of the initial conductive layer 153A over the intermediate material layer 152B is higher than that of the other portions, a planarization process such as CMP may be further performed on the initial conductive layer 154A to make the planarized upper surface.

Figure 8A:
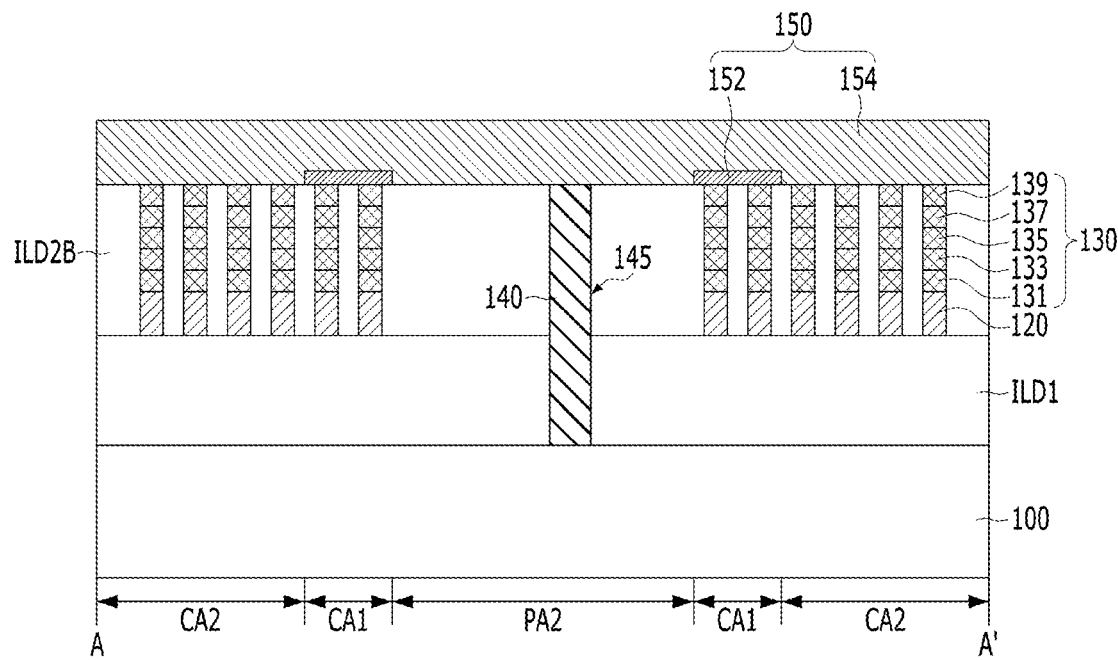
Figure 8B:
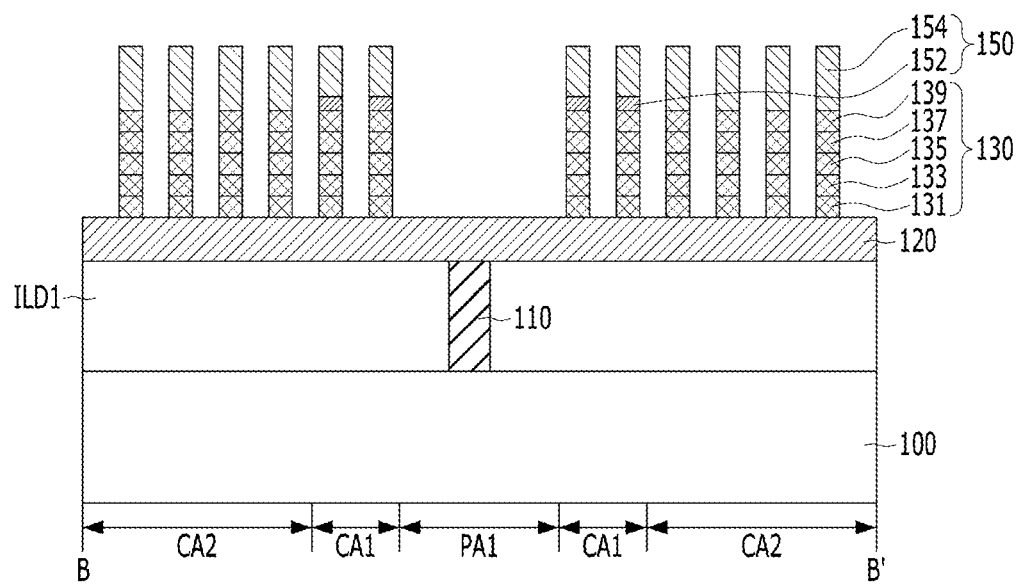

Referring to FIGS. 8A and 8B, the initial conductive layer 154A and the intermediate material layer 152B in the first cell region CA1 may be etched using a line-shaped mask pattern (not shown) extending in the second direction as an etching barrier. As a result, the second line 150 including the material layer 152 and the conductive layer 154 may be formed. The second line 150 may have a line shape extending in the second direction while overlapping and being connected with the second contact plug 140.

Subsequently, a memory cell 130 may be formed by etching the initial memory cell 130A exposed by the second line 150. During this process, the initial second interlayer insulating layer ILD2A exposed by the second line 150 may be etched together to form an intermediate second interlayer insulating layer ILD2B. As a result of this process, the memory cell 130 may have an island shape in a plan view while being positioned at an intersection between the first line 120 and the second line 150. In the first direction, both sidewalls of the memory cell 130 may be aligned with both sidewalls of the second line 150, and in the second direction, both sidewalls of the memory cell 130 may be aligned with both sidewalls of the first line 120. The memory cell 130 may include a stacked structure of a lower electrode layer 131, a selection element layer 133, an intermediate electrode layer 135, a variable resistance layer 137, and an upper electrode layer 139.

After that, although it is not shown, spaces between the memory cells 130 in the first direction may be filled with an insulating material, so that the second interlayer insulating layer ILD2 filling spaces between the memory cells 130 and spaces between the memory cells 130 and the second contact plugs 140 is formed as shown in FIGS. 2A and 2B.

A memory device substantially the same as that described in is FIGS. 1, 2A, and 2B may be obtained by the above-described processes shown in FIGS. 3A to 8B.

FIGS. 9A to 13B are cross-sectional views illustrating a method of fabricating the memory device shown in FIG. 1 according to another embodiment of the present disclosure. FIGS. 9A, 10A, 11A, 12A, and 13A are shown based on a cross section taken along the line A-A' of FIG. 1, and FIGS. 9B, 10B, 11B, 12B, and 13B are shown based on a cross section taken along the line B-B' of FIG. 1. It will be described focusing on differences from the above-described embodiment.

Figure 9A:
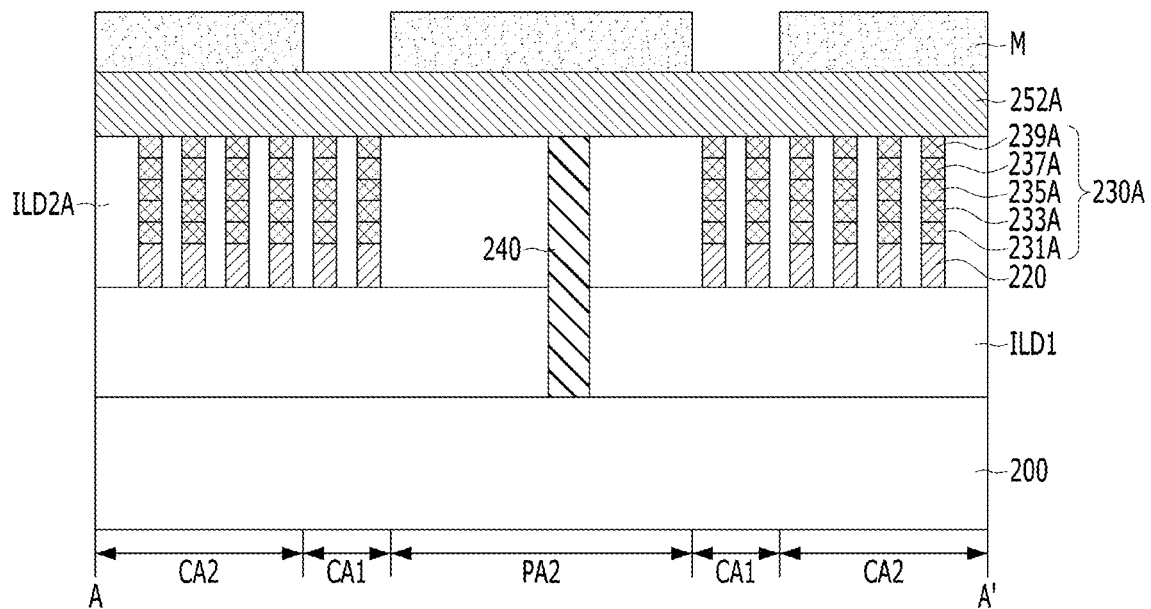
FIGS. 9A, 10A, 11A, 12A, and 13A are cross-sectional views taken along the line A-A' of FIG. 1, and FIGS. 9B, 1013, 11B, 12B, and 13B are cross-sectional views taken along the line B-B' of FIG. 1, according to another embodiment of the present disclosure.
Figure 9B:
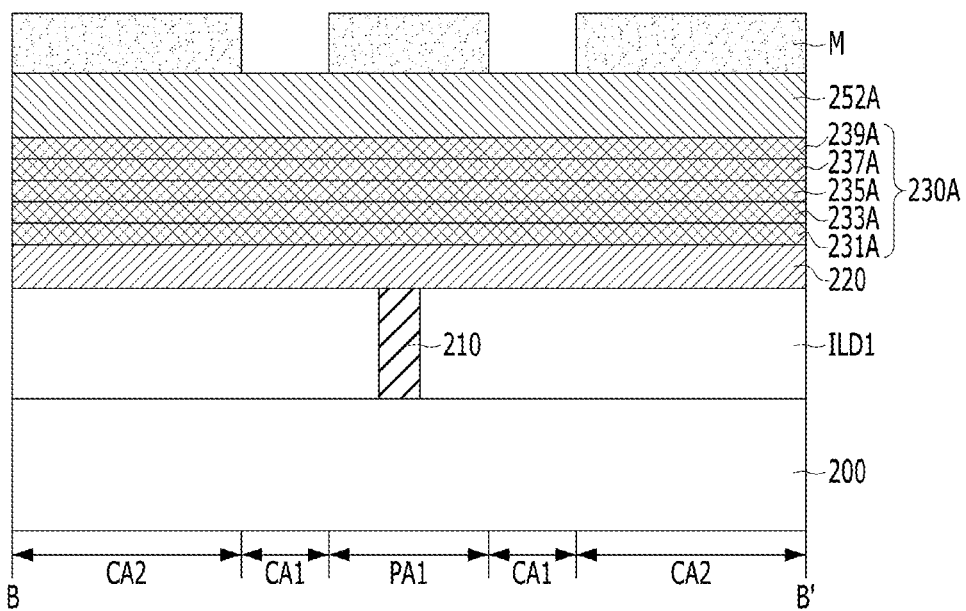

Referring to FIGS. 9A and 9B, processes substantially the same as the processes described above with reference to FIGS. 3A to 4B may be performed. As a result, there may be provided a structure that includes a substrate 200 including a first cell region CA1, a second cell region CA2, a first peripheral circuit region PA1, and a second peripheral circuit region PA2, a first interlayer insulating layer ILD1 disposed over the substrate 200, a first contact plug 210 connected to a portion of the substrate 200 through the first interlayer insulating layer ILD1 in the first peripheral circuit region PA1, a stacked structure of a first line 220 and an initial memory cell 230A disposed over the first interlayer insulating layer ILD1 and extending in a first direction to be connected to the first contact plug 210, an initial second interlayer insulating layer ILD2A disposed over the first interlayer insulating layer ILD1 and filling spaces between the stacked structures of the first line 220 and the initial memory cell 230A, and a second contact plug 240 connected to a portion of the substrate 200 through the initial second interlayer insulating layer ILD2A and the first interlayer insulating layer ILD1 in the second peripheral circuit region PA2. Here, the initial memory cell 230A may include a stacked structure of an initial lower electrode layer 231A, an initial selection element layer 233A, an initial intermediate electrode layer 235A, an initial variable resistance layer 237A, and an initial upper electrode layer 239A.

Subsequently, an initial first conductive layer 252A may be formed over the above structure including the initial memory cell 230A. The initial first conductive layer 252A may include a low-resistance conductive material such as a metal or a metal nitride. In particular, the initial first conductive layer 252A may have a lower resistance than a second conductive layer to be described later. For example, the initial first conductive layer 252A may be formed using PVD.

Subsequently, a mask pattern M may be formed over the initial first conductive layer 252A to open the first cell region CA1 while covering the second cell region CA2. In the present embodiment, the mask pattern M may also cover the peripheral circuit regions PA1 and PA2. However, embodiments are not limited thereto. In another embodiment, the peripheral circuit regions PA1 and PA2 may be partially or fully opened by the mask pattern M.

Figure 10A:
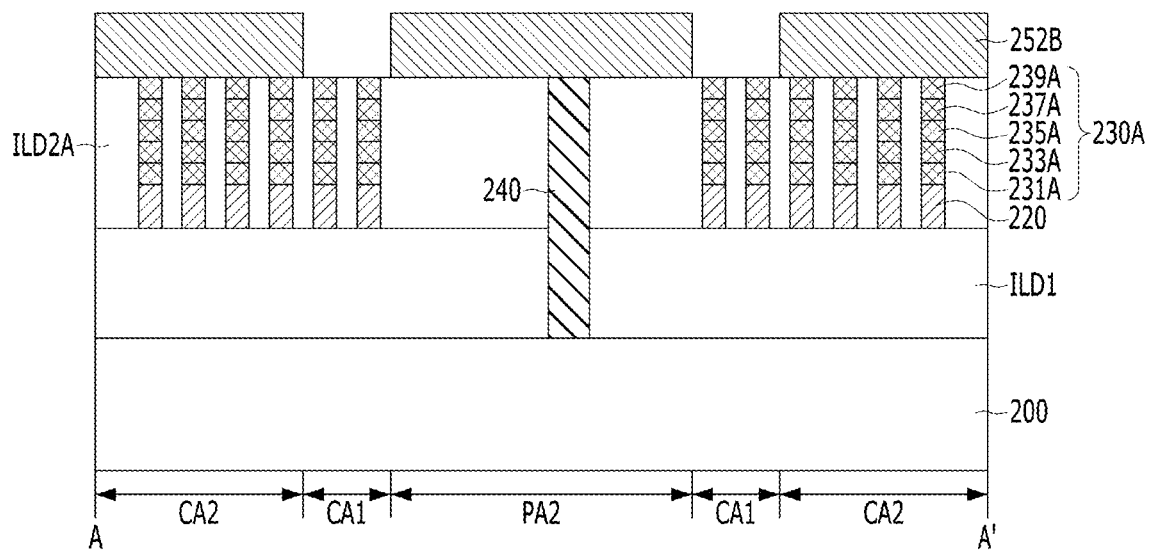
Figure 10B:
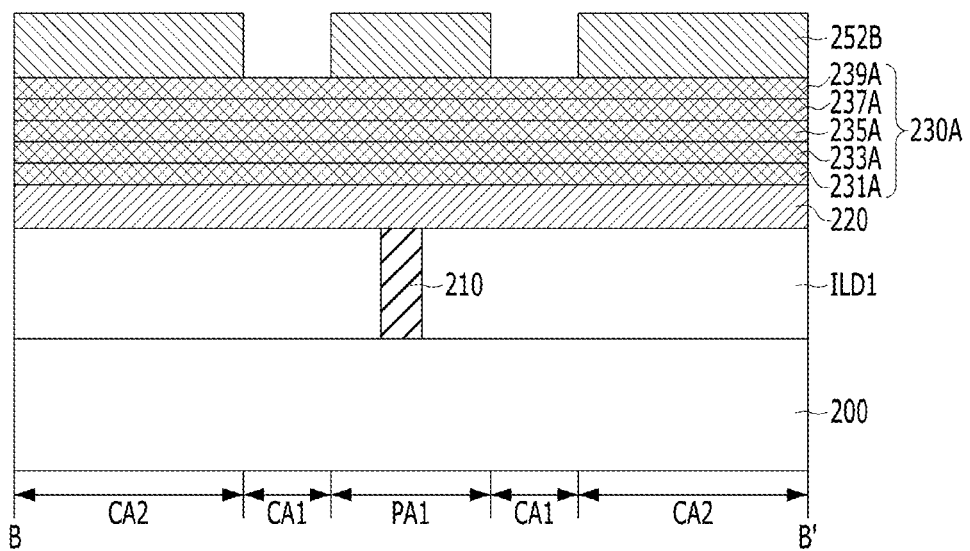

Referring to FIGS. 10A and 10B, the initial first conductive layer 252A may be etched using the mask pattern M as an etching barrier to form an intermediate first conductive layer 252B. As a result of this process, the intermediate first conductive layer 252B may not exist in the first cell region CA1 and may exist only in the second cell region CA2. That is, the intermediate first conductive layer 252B may have a shape to open the first cell region CA1.

Subsequently, the mask pattern M may be removed.

Figure 11A:
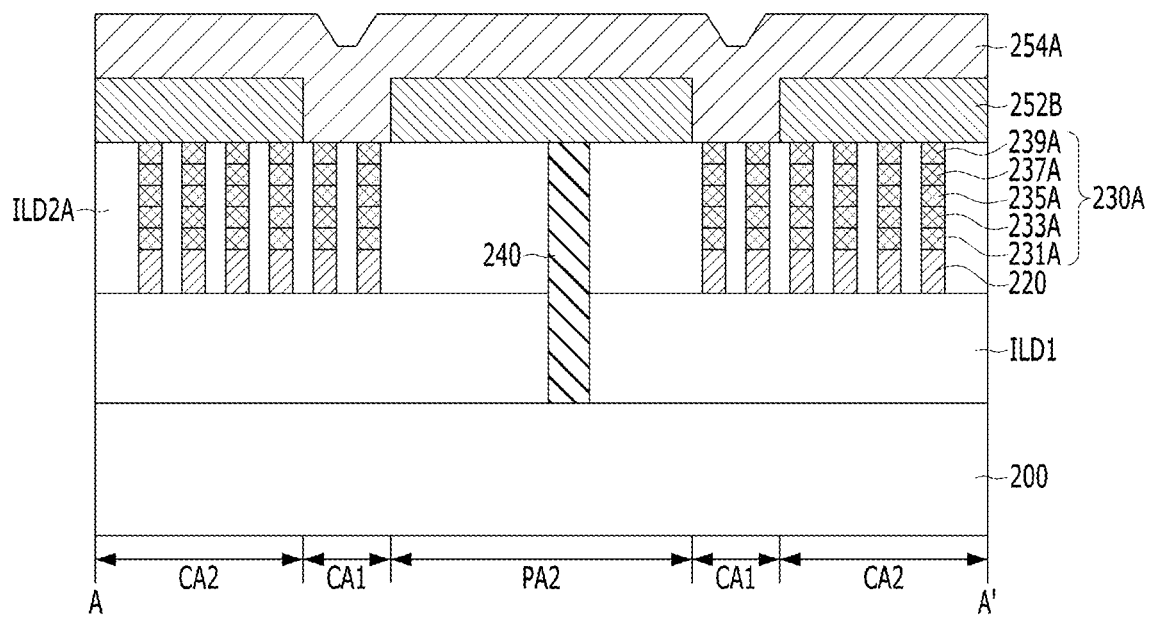
Figure 11B:
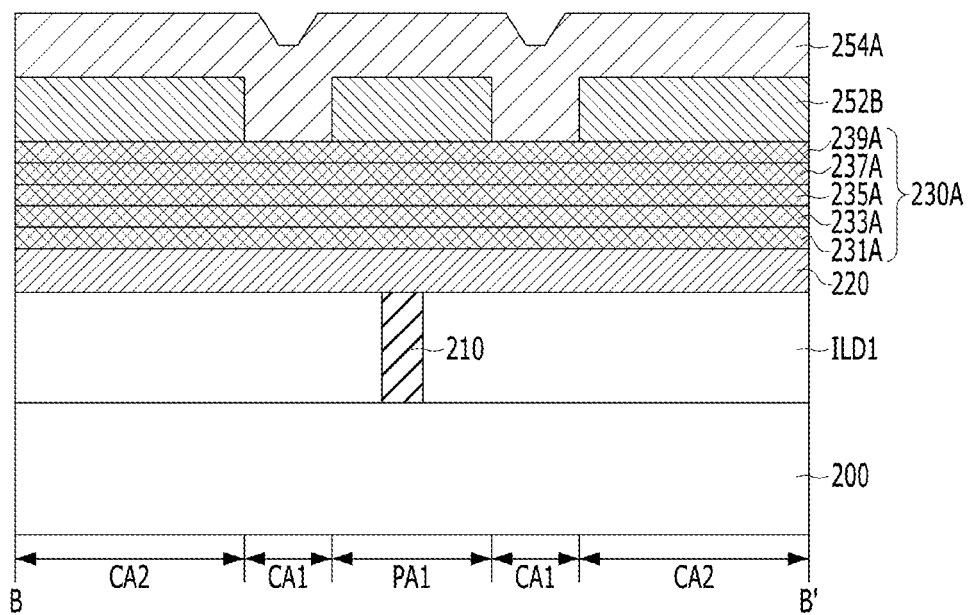

Referring to FIGS. 11A and 11B, an initial second conductive layer 254A may be formed over a resultant structure of FIGS. 10A and 10B.

The initial second conductive layer 254A may be formed to sufficiently fill spaces between the intermediate first conductive layers 252B in the first cell region CA1. A level of an upper surface of the initial second conductive layer 254A over the intermediate first conductive layer 252B may be higher than a level of an upper surface of the initial second conductive layer 254A in the first cell region CA1. For example, the initial second conductive layer 254A may be formed using PVD.

In this case, the initial second conductive layer 254A may include a conductive material having a higher resistance than the intermediate first conductive layer 252B. For example, the initial second conductive layer 254A and the intermediate first conductive layer 252B may include different conductive materials, that is, conductive materials composed of different elements. For example, the intermediate first conductive layer 252B may include tungsten (W), and the initial second conductive layer 254A may include titanium nitride (TiN) having a higher resistance than tungsten (W). Alternatively, the initial second conductive layer 254A and the intermediate first conductive layer 252B may include the same conductive material, that is, a conductive material composed of the same element. For example, the intermediate first conductive layer 252B and the initial second conductive layer 254A may include tungsten (W). Even in this case, various characteristics of the initial second conductive layer 254A and the intermediate first conductive layer 252B may be adjusted to have different resistances. For example, the intermediate first conductive layer 252B may include low-resistance tungsten and the initial second conductive layer 254A may include high-resistance tungsten.

One of the various characteristics for controlling a resistance in the same material may be grain boundary. For example, a grain boundary of the initial second conductive layer 254A may be larger than a grain boundary of the intermediate first conductive layer 252B, and thus, the resistance of the initial second conductive layer 254A may be greater than the resistance of the intermediate first conductive layer 252B. In order for the intermediate first conductive layer 252B and the initial second conductive layer 254A to contain the same conductive material, such as a metal, and have the grain boundaries of different sizes, RF bias applied during PVD for forming the intermediate first conductive layer 252B and the initial second conductive layer 254A may be adjusted. For example, the RF bias applied during the deposition of the initial second conductive layer 254A may be smaller than the RF bias applied during the deposition of the intermediate first conductive layer 252B, and thus, the grain boundary of the initial second conductive layer 254A and the resistance thereof may be increased than the gran boundary of the intermediate first conductive layer 252B and the resistance thereof.

Figure 12A:
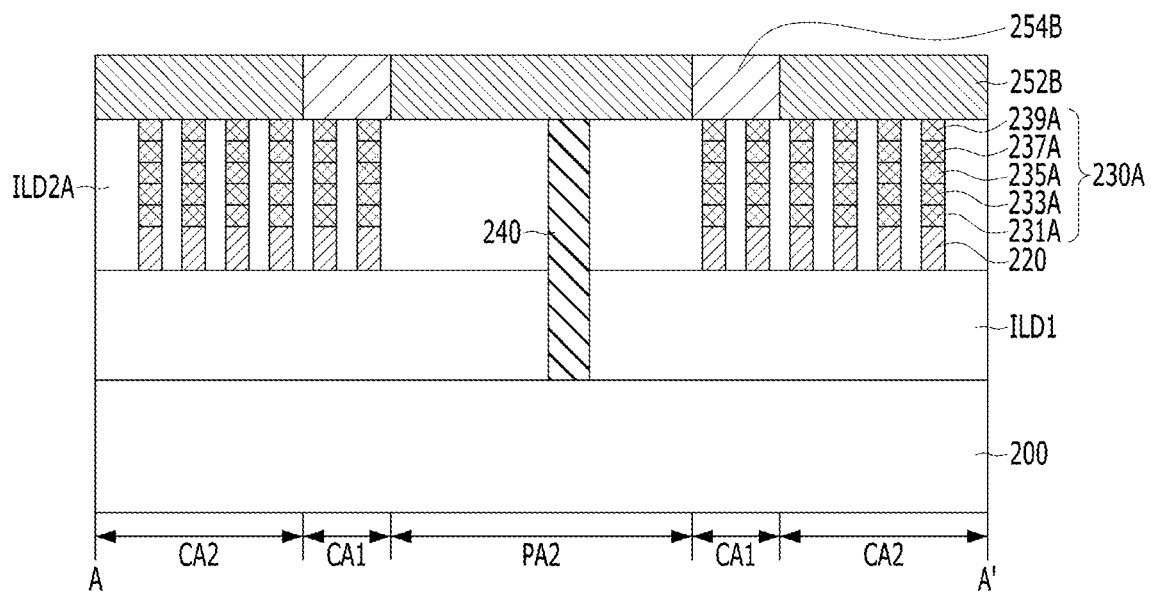
Figure 12B:
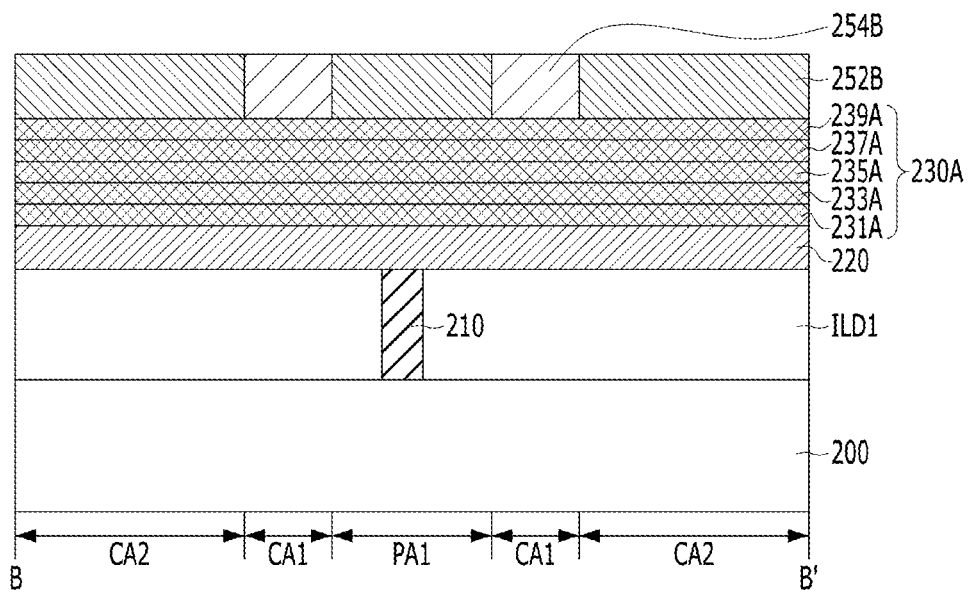

Referring to FIGS. 12A and 12B, a planarization process, for example, CMP, may be performed on the initial second conductive layer 254A until an upper surface of the intermediate first conductive layer 252B is exposed. As a result, an intermediate second conductive layer 254B may be formed to fill the space between the intermediate first conductive layers 252B in the first cell region CA1.

The intermediate first conductive layer 252B and the intermediate second conductive layer 254B may have planarized upper surfaces that are level with each other. Accordingly, the intermediate first conductive layer 252B and the intermediate second conductive layer 254B may have the same thickness.

Figure 13A:
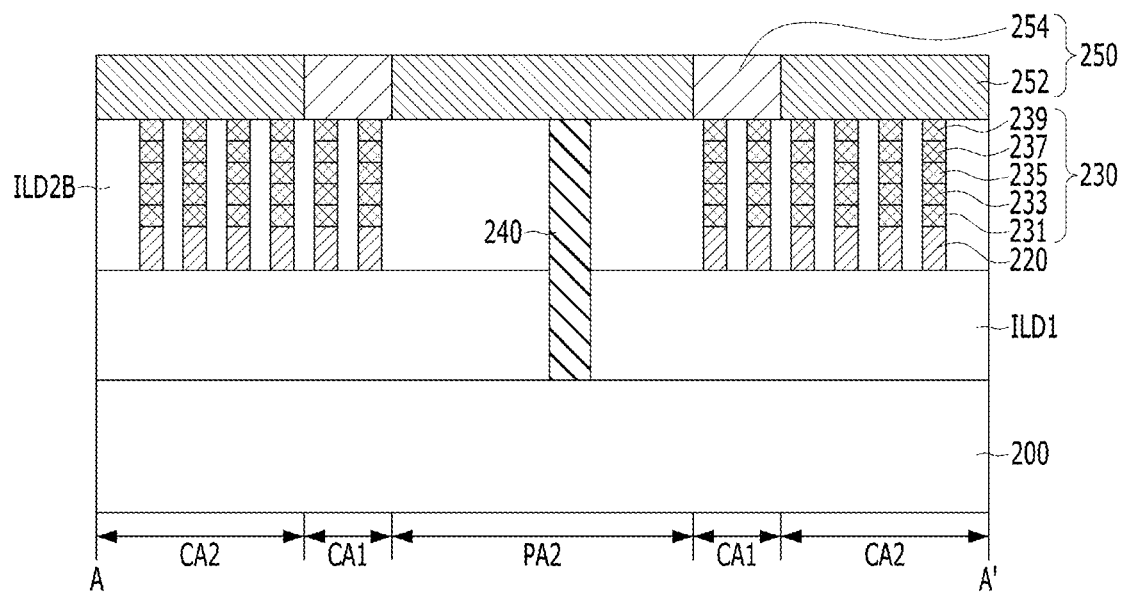
Figure 13B:
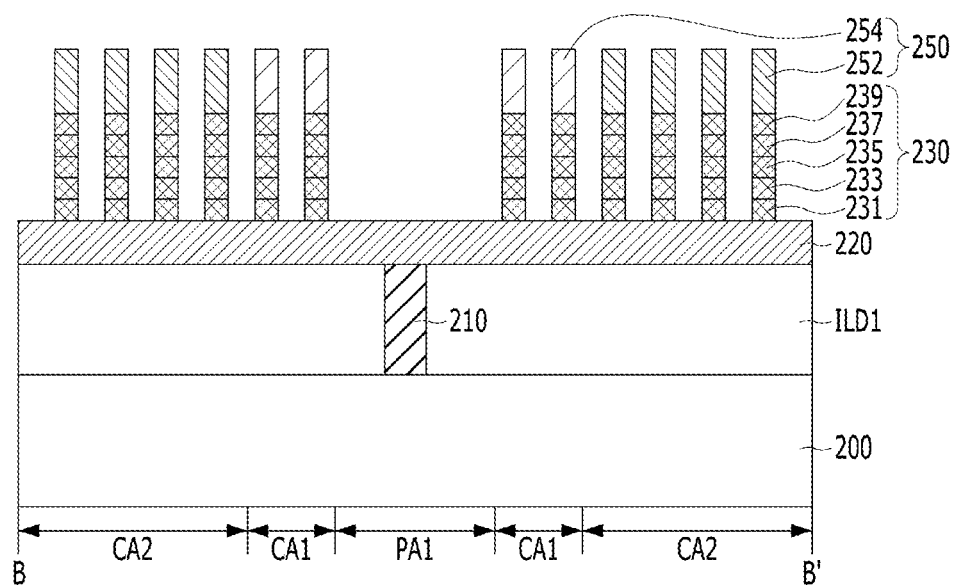

Referring to FIGS. 13A and 13B, the intermediate first conductive layer 252B and the intermediate second conductive layer 254B may be etched using a line-shaped mask pattern (not shown) extending in the second direction as an etching barrier. As a result, a second line 250 including a first conductive layer 252 and a second conductive layer 254 may be formed. The second line 250 may have a line shape extending in the second direction while overlapping and being connected with the second contact plug 240.

Subsequently, a memory cell 230 may be formed by etching the initial memory cell 230A exposed by the second line 250. During this process, the initial second interlayer insulating layer ILD2A exposed by the second line 250 may be etched together to form an intermediate second interlayer insulating layer ILD2B.

The memory device of the present embodiment may be obtained by the processes described with reference to FIGS. 9A to 13B. According to the present embodiment, the second line 250 may include the second conductive layer 254 formed in the first cell region CA1 and the first conductive layer 252 formed in the second cell region CA2. The second conductive layer 254 has a higher resistance than the first conductive layer 252.

In this case, as in the above-described embodiment, because the resistance of the second line 250 is selectively increased only in the first cell region CA1, it may be possible to prevent excessive current from flowing through the memory cell 230 disposed in the first cell region CA1. Furthermore, the fabricating processes may be simple, and may not affect the characteristics of the memory cells 230.

FIGS. 14A to 17B are cross-sectional views illustrating a method of fabricating the memory device shown in FIG. 1 according to still another embodiment of the present disclosure. FIGS. 14A, 15A, 16, and 17A are shown based on a cross section taken along the line A-A' of FIG. 1, and FIGS. 14B, 15B, 16B, and 17B are shown based on a cross section taken along the line B-B' of FIG. 1. It will be described focusing on differences from the above-described embodiments.

Figure 14A:
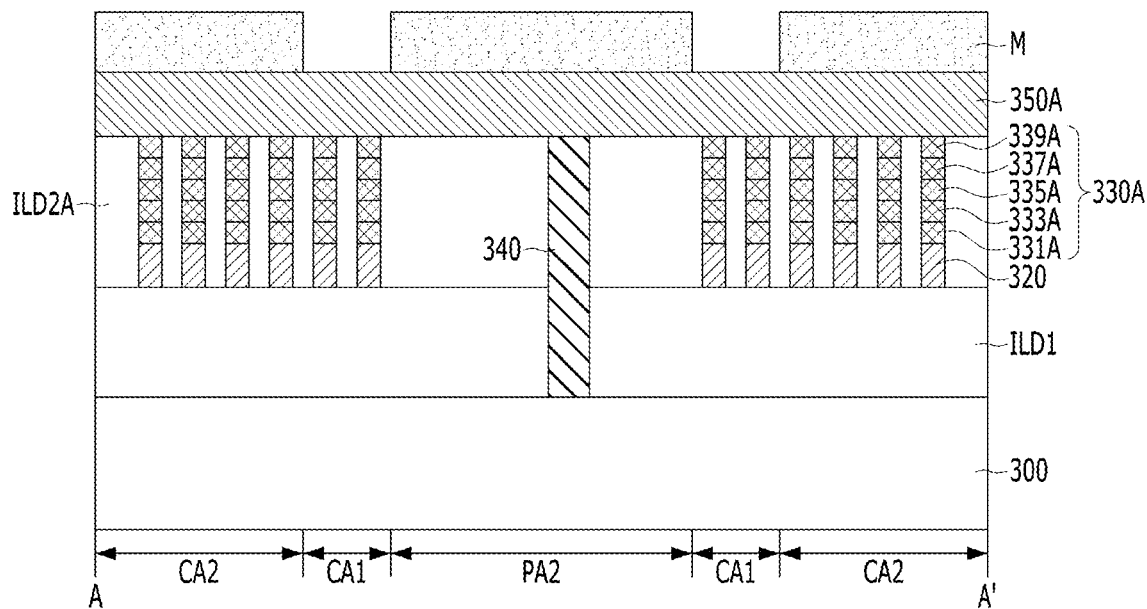
FIGS. 14A, 15A, 16A, and 17A are cross-sectional views taken along the line A-A' of FIG. 1, and FIGS. 14B, 15B, 16B, and 17B are cross-sectional views taken along the line B-B' of FIG. 1, according to still another embodiment of the present disclosure.
Figure 14B:
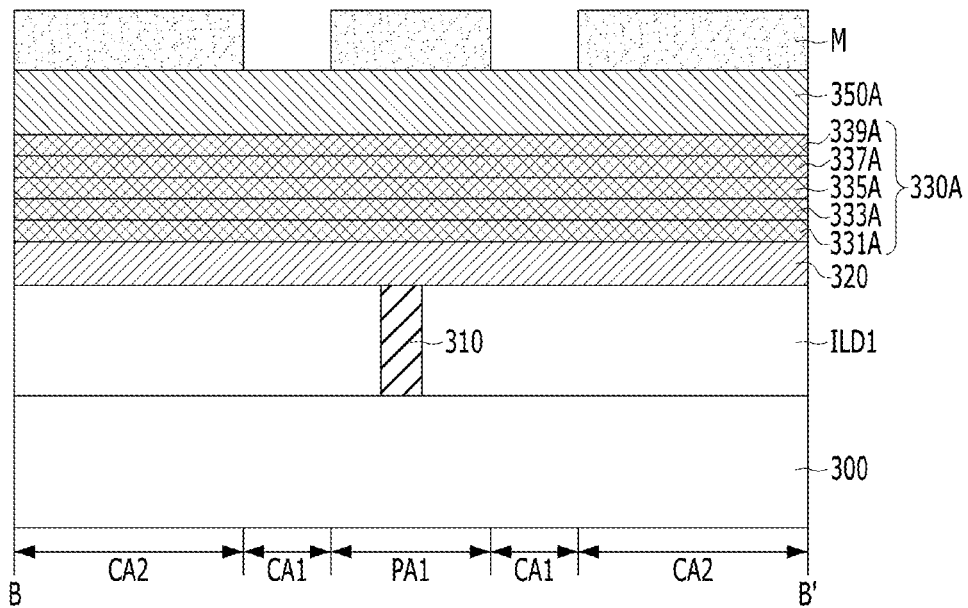

Referring to FIGS. 14A and 14B, processes substantially the same as the processes described above with reference to FIGS. 3A to 4B may be performed. As a result, there may be provided a structure including a substrate 300 including a first cell region CA1, a second cell region CA2, a first peripheral circuit region PA1, and a second peripheral circuit region PA2, a first interlayer insulating layer ILD1 disposed over the substrate 300, a first contact plug 310 connected to a portion of the substrate 300 through the first interlayer insulating layer ILD1 in the first peripheral circuit region PA1, a stacked structure of a first line 320 and an initial memory cell 330A disposed over the first interlayer insulating layer ILD1 and extending in a first direction to be connected to the first contact plug 310, an initial second interlayer insulating layer ILD2A disposed over the first interlayer insulating layer ILD1 and filling spaces between the stacked structures of the first line 320 and the initial memory cell 330A, and a second contact plug 340 connected to a portion of the substrate 300 through the initial second interlayer insulating layer ILD2A and the first interlayer insulating layer ILD1 in the second peripheral circuit region PA2. Here, the initial memory cell 330A may include a stacked structure of an initial lower electrode layer 331A, an initial selection element layer 333A, an initial intermediate electrode layer 335A, an initial variable resistance layer 337A, and an initial upper electrode layer 339A.

Subsequently, an initial conductive layer 350A may be formed over the above structure including the initial memory cell 330A. The initial conductive layer 350A may include a low-resistance conductive material such as a metal or a metal nitride.

Subsequently, a mask pattern M may be formed over the initial conductive layer 350A to open the first cell region CA1 while covering the second cell region CA2. In the present embodiment, the mask pattern M may also cover the peripheral circuit regions PA1 and PA2. However, embodiments are not limited thereto. In another embodiment, the peripheral circuit regions PA1 and PA2 may be partially or fully opened by the mask pattern M.

Figure 15A:
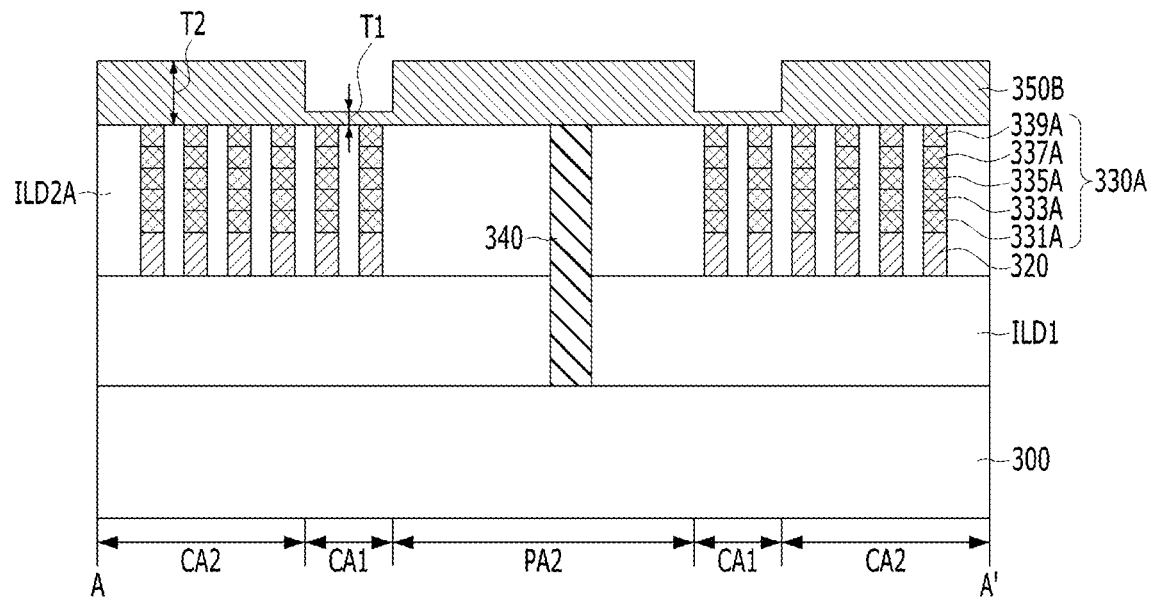
Figure 15B:
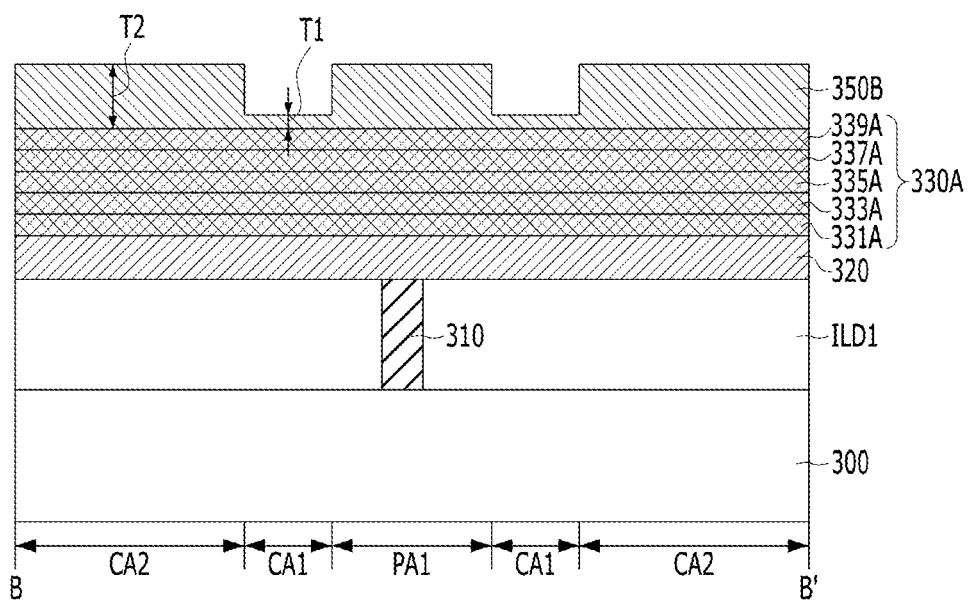

Referring to FIGS. 15A and 15B, a portion of the initial conductive layer 350A may be etched using the mask pattern M as an etching barrier to form an intermediate conductive layer 350B. As a result of this process, the intermediate conductive layer 350B may have a first thickness T1 in the first cell region CA1 and a second thickness T2 in the second cell region CA2. The first thickness T1 may be smaller than the second thickness T2.

Subsequently, the mask pattern M may be removed.

Figure 16A:
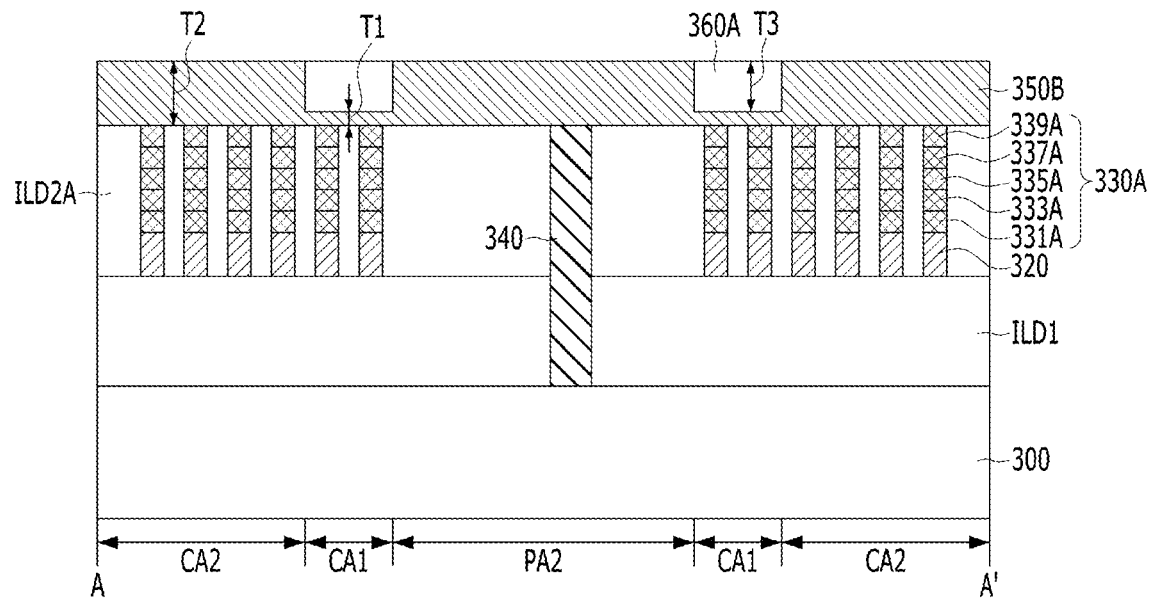
Figure 16B:
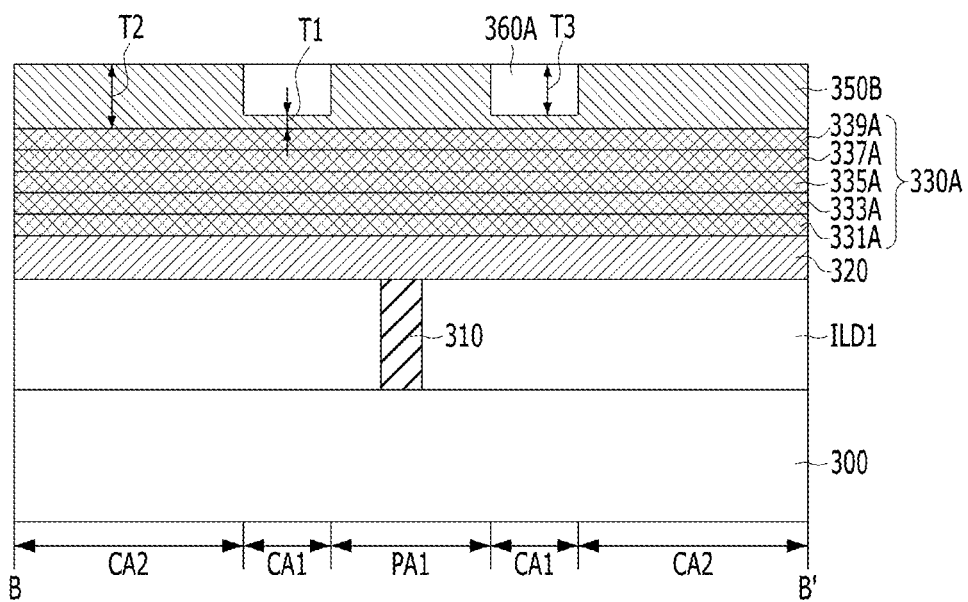

Referring to FIGS. 16A and 16B, an initial insulating pattern 360A may be formed over the intermediate conductive layer 350B in the first cell region CA1.

The initial insulating pattern 360A may by formed by depositing an insulating material to sufficiently fill a space formed over the intermediate conductive layer 350B in the first cell region CA1. The space is formed by a difference in the first and second thicknesses T1 and T2 of the intermediate conductive layer 350B in the first cell region CA1 and the second cell region CA2. The deposited insulating material is planarized until an upper surface of the intermediate conductive layer 350B in the second cell region CA2 is exposed. The initial insulating pattern 360A may include one of various insulating materials, such as silicon oxide, silicon nitride, or a combination thereof.

The initial insulating pattern 360A in the first cell region CA1 and the intermediate conductive layer 350B in the second cell region CA2 may have upper surfaces that are level with each other. Accordingly, the sum of the first thickness T1 of the intermediate conductive layer 350B in the first cell region CA1 and a thickness T3 of the initial insulating pattern 360A may be substantially the same as the second thickness T2 of the intermediate conductive layer 350B in the second cell region CA2.

Figure 17A:
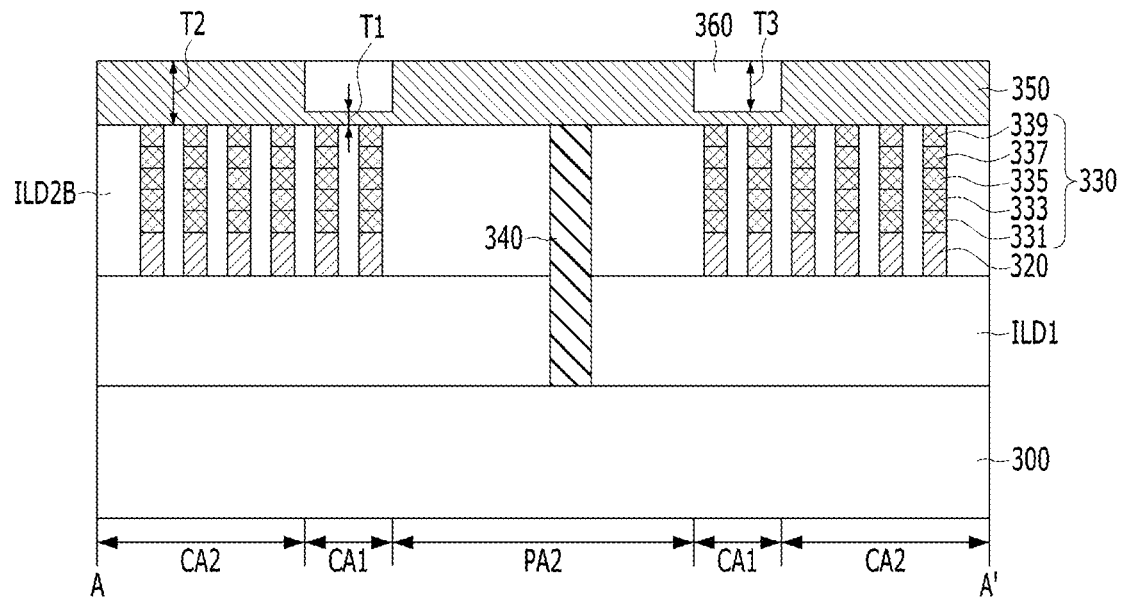
Figure 17B:
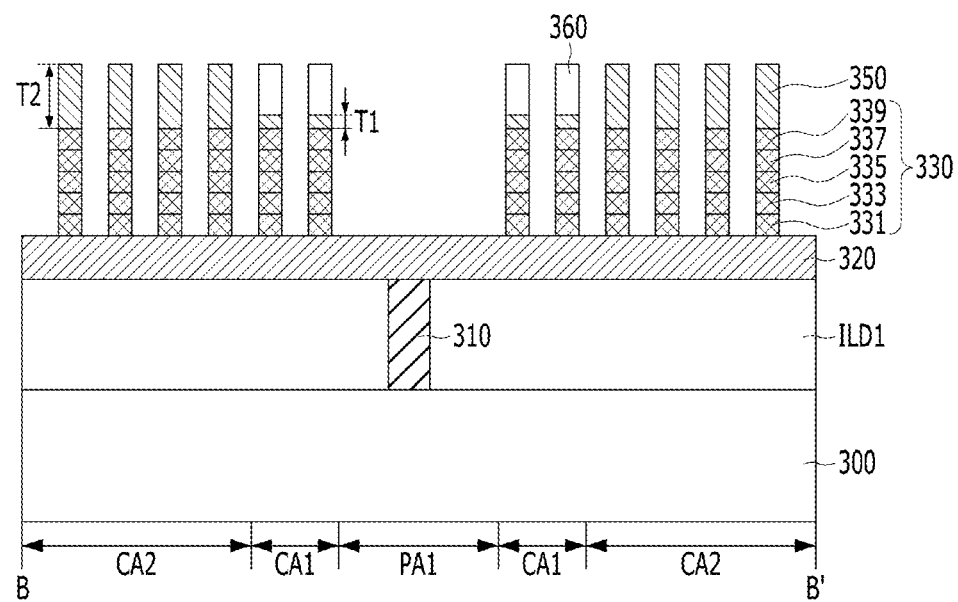

Referring to FIGS. 17A and 17B, the intermediate conductive layer 350B and the initial insulating pattern 360A may be etched using a line-shaped mask pattern (not shown) extending in the second direction as an etching barrier to form a second line 350. The second line 350 may have a line shape extending in the second direction while overlapping and being connected with the second contact plug 340. In addition, the second line 350 may have the first thickness T1 in the first cell region CA1 and the second thickness T2 in the second cell region CA2. During this etching process, the initial insulating pattern 360A may be etched before the intermediate conductive layer 350B in the first cell region CA1 is etched to form an insulating pattern 360. The insulating pattern 360 may be formed over the second line 350 in the first cell region CA1.

Subsequently, a memory cell 330 may be formed by etching the initial memory cell 330A exposed by the second line 350. During this process, the initial second interlayer insulating layer ILD2A exposed by the second line 350 may be etched together to form an intermediate second interlayer insulating layer ILD2B.

The memory device of the present embodiment may be obtained by the processes described above with reference to FIGS. 14A to 17B. According to the present embodiment, the second line 350 may have a higher resistance in the first cell region CA1 than in the second cell region CA2 by having a smaller thickness in the first cell region CA1 than in the second cell region CA2.

In this case, as in the above-described embodiment, because the resistance of the second line 350 is selectively increased only in the first cell region CA1, it may be possible to prevent excessive current from flowing through the memory cell 330 disposed in the first cell region CA1. Furthermore, the fabricating processes may be simple, and may not affect the characteristics of the memory cell 330.

Meanwhile, in the above-described embodiments, a case in which the memory device includes a single stack including memory cells between one layer of first lines and one layer of the second lines has been described, but embodiments are not limited thereto. In another embodiment, a memory device may include two or more stacks stacked in a vertical direction. This will be exemplarily described with reference to FIGS. 18A and 18B.

Figure 18A:
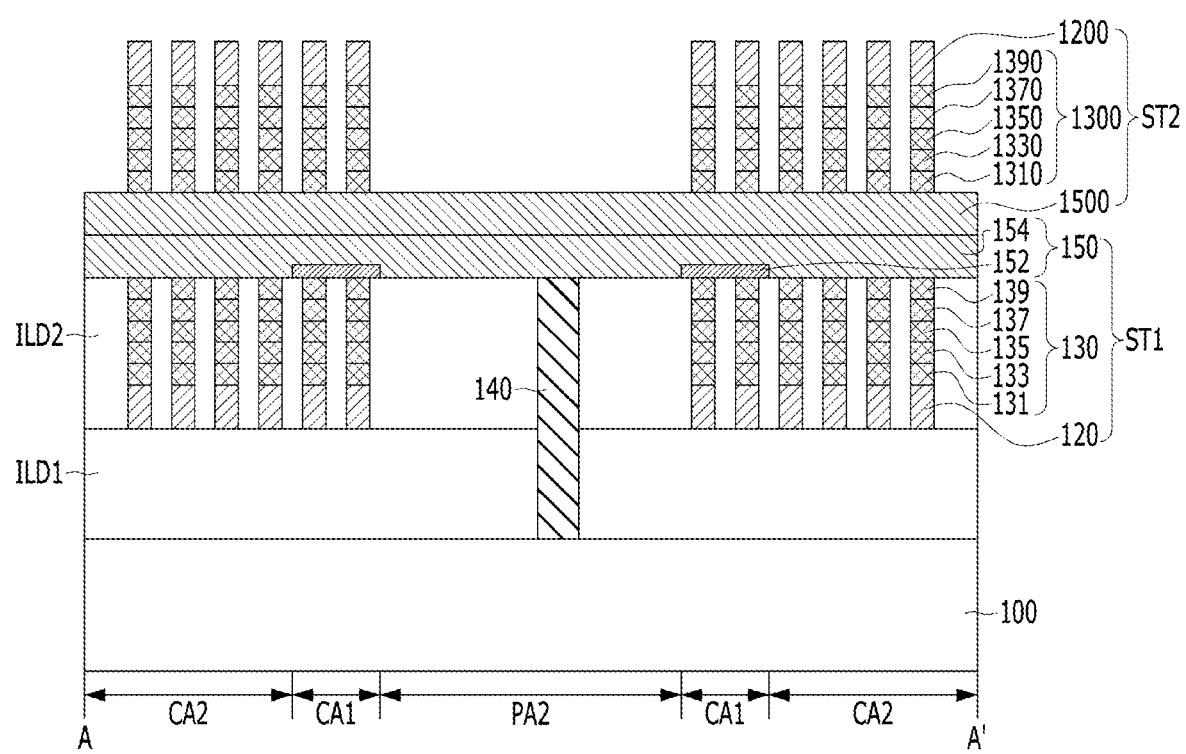
FIGS. 18A and 18B are cross-sectional views illustrating a memory device according to another embodiment of the present disclosure.
Figure 18B:
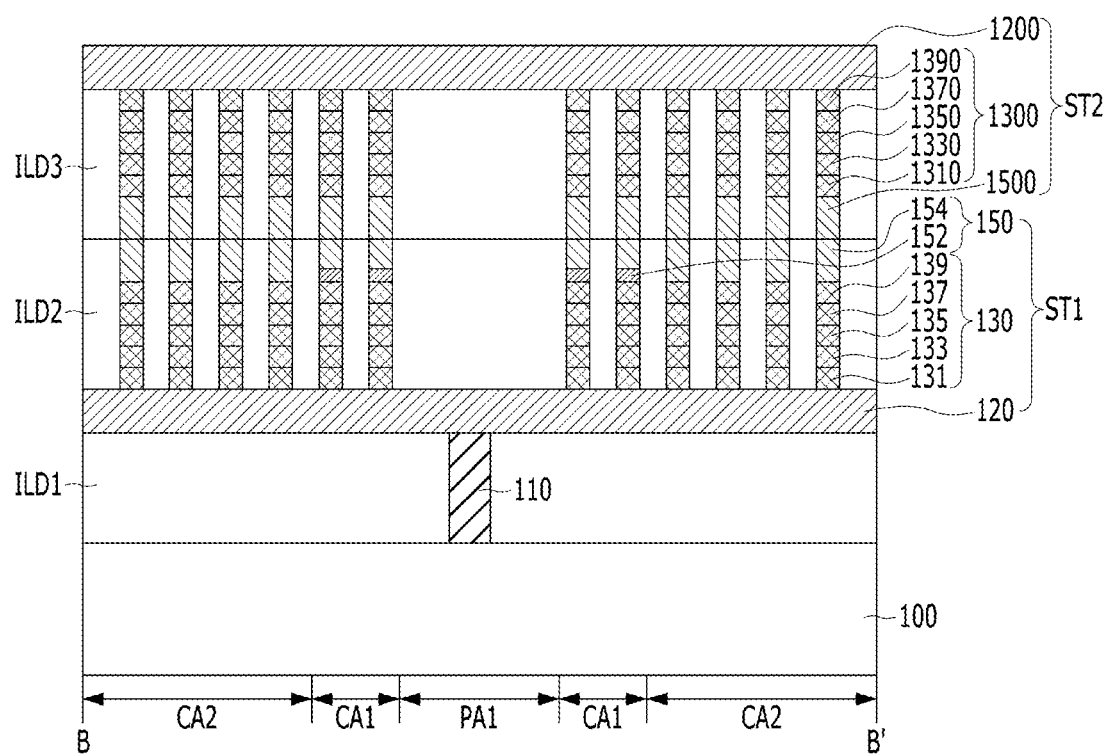

FIGS. 18A and 18B are cross-sectional views illustrating a memory device according to another embodiment of the present disclosure.

Referring to FIGS. 18A and 18B, the memory device may include a substrate 100, a first stack ST1 disposed over the substrate 100, and a second stack ST2 disposed over the first stack ST1. The first stack ST1 may include first lines 120 disposed over the substrate 100 and extending in a first direction, second lines 150 disposed over the first lines 120 and extending in a second direction crossing the first direction, and first memory cells 130 positioned at intersections between the first lines 120 and the second lines 150. The second stack ST2 may include third lines 1500 disposed over the first stack ST1 and extending in the second direction, fourth lines 1200 disposed over the third lines 1500 and extending in the first direction, and second memory cells 1300 positioned at intersections between the third lines 1500 and the fourth lines 1200.

The substrate 100 and the first stack ST1 of the present embodiment may be substantially the same as those of the memory device shown in FIGS. 2A and 2B. Accordingly, the same reference numerals are used in describing them, and the detailed description thereof will be omitted.

In a plan view, the third line 1500 may overlap the second line 150, and a lower surface of the third line 1500 may contact an upper surface of the second line 150. For this reason, the second line 150 and the third line 1500 may function as one line. That is, the second line 150 and the third line 1500 may transfer a voltage or current to one end of the first memory cell 130 of the first stack ST1, and may transfer a voltage or current to one end of the second memory cell 1300 of the second stack ST2. That is, the second line 150 and the third line 1500 may function as a common line of the first and second stacks ST1 and ST2, for example, a common bit line or a common word line.

However, the third line 1500 may have a constant resistance in the first cell region CA1 and the second cell region CA2. For example, the third line 1500 may include a low-resistance conductive material such as a metal or a metal nitride, and may have a single-layered structure. For example, the third line 1500 may include the same material as the conductive layer 154 of the second line 150. Accordingly, in the first cell region CA1, the resistance of the third line 1500 may be smaller than the resistance of the second line 150. Even in this case, because the second line 150 and the third line 1500 are in contact, a resistance of a common line formed by the second line 150 and the third line 1500 in the first cell region CA1 may be increased compared to a resistance of the common line in the second cell region CA2. Therefore, it may be possible to prevent excessive current from flowing through the first memory cell 130 and the second memory cell 1300 in the first cell region CA1.

In a plan view, the fourth line 1200 may overlap the first line 120. When the first line 120 functions as a word line, the fourth line 1200 may also function as a word line. Alternatively, when the first line 120 functions as a bit line, the fourth line 1200 may also function as a bit line.

The second memory cells 1300 may be arranged to overlap the first memory cells 130, respectively. The second memory cell 1300 may include a multi-layered structure of a lower electrode layer 1310, a selection element layer 1330, an intermediate electrode layer 1350, a variable resistance layer 1370, and an upper electrode layer 1390 in the same manner as the first memory cell 130. However, in another embodiment, the second memory cell 1300 may have a symmetrical structure with the first memory cell 130, with respect to the second and third lines 150 and 1500 interposed therebetween. That is, the second memory cell 1300 may include a stacked structure of a lower electrode layer 1310, a variable resistance layer 1330, an intermediate electrode layer 1350, a selection element layer 1370, and an upper electrode layer 1390.

According to the memory device of the present embodiment, it may be possible to implement a highly integrated memory device while obtaining all the effects of the embodiments described above with reference to FIGS. 1, 2A, and 2B.

Although not shown, three or more stacks may be repeatedly stacked over the substrate 100. For example, a third stack stacked over the second stack ST2 may have the same structure as the first stack ST1. In addition, a fourth stack stacked over the third stack may have the same structure as the second stack ST2.

Further, although not shown, in the memory device of FIGS. 18A and 18B, the substrate 100 and the first stack ST1 may be replaced with the corresponding structure in the memory device of FIGS. 13A and 13B. Even in this case, because the second line 250 of FIGS. 13A and 13B and the third line 1500 of FIGS. 18A and 18B are in contact, a resistance of a common line formed by the second line 250 and the third line 1500 in the first cell region CA1 may be increased compared to a resistance of the common line in the second cell region CA2.

Further, although not shown, in the memory device of FIGS. 18A and 18B, the substrate 100 and the first stack ST1 may be replaced with the corresponding structure in the memory device of FIGS. 17A and 17B. Even in this case, because the second line 350 of FIGS. 17A and 17B and the third line 1500 of FIGS. 18A and 18B are in contact, a resistance of a common line formed by the second line 350 and the third line 1500 in the first cell region CA1 may be increased compared to a resistance of the common line in the second cell region CA2.

Figure 19:
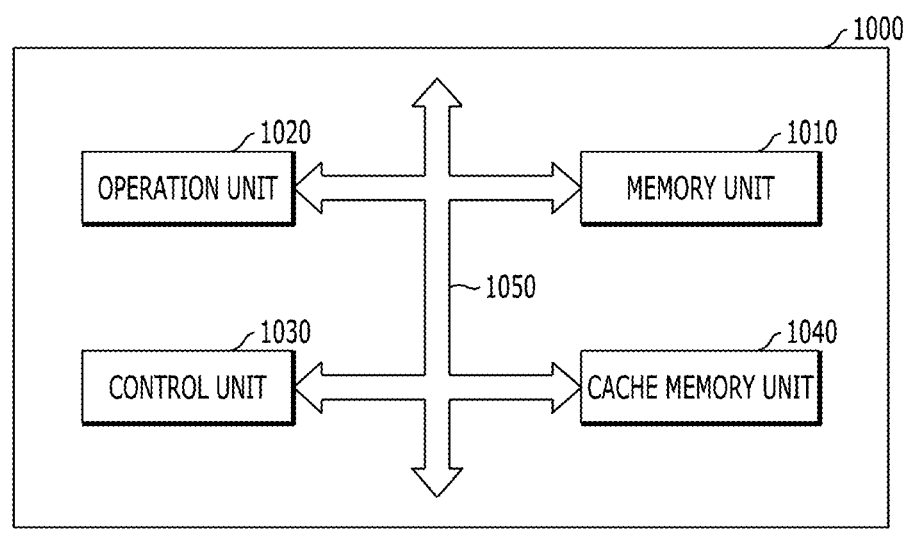
FIG. 19 is a configuration diagram of a microprocessor implementing memory circuitry based on the disclosed technology.

FIG. 19 is a configuration diagram of a microprocessor 1000 implementing memory circuitry based on the disclosed technology.

Referring to FIG. 19, the microprocessor 1000 may perform tasks for controlling and tuning a series of processes of receiving data from various external devices, processing the data, and outputting processing results to the external devices. The microprocessor 1000 may include a memory unit 1010, an operation unit 1020, a control unit 1030, and so on. The microprocessor 1000 may be any of various data processing units such as a central processing unit (CPU), a graphic processing unit (GPU), a digital signal processor (DSP), an application processor (AP), and so on.

The memory unit 1010 is a part which stores data in the microprocessor 1000, as a processor register, a register, or the like. The memory unit 1010 may include various registers such as a data register, an address register, a floating point register, and so on. The memory unit 1010 may perform the function of temporarily storing data for which operations are to be performed by the operation unit 1020, result data of performing the operations, and addresses where data for performing the operations are stored.

The memory unit 1010 may include one or more of the above-described semiconductor devices in accordance with the embodiments. For example, the memory unit 1010 may include a substrate including a cell region, a first peripheral circuit region disposed at one side of the cell region in a first direction, and a second peripheral circuit region disposed at one side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; and a first memory cell positioned at each of intersections between the first lines and the second lines in the cell region, wherein the cell region includes a first cell region and a second cell region, the first cell region being disposed closer to the first and second peripheral circuit regions than the second cell region, and wherein a first portion of the second line that is in the first cell region has a greater resistance than a second portion of the second line that is in the second cell region. Through this, operating characteristics of the memory unit 101 may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020, and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data inputted from an external device other than the memory unit 1010 or data to be outputted to an external device. In this case, the cache memory unit 1040 may exchange data with the memory unit 1010, the operation unit 1020, and the control unit 1030 through a bus interface 1050.

Figure 20:
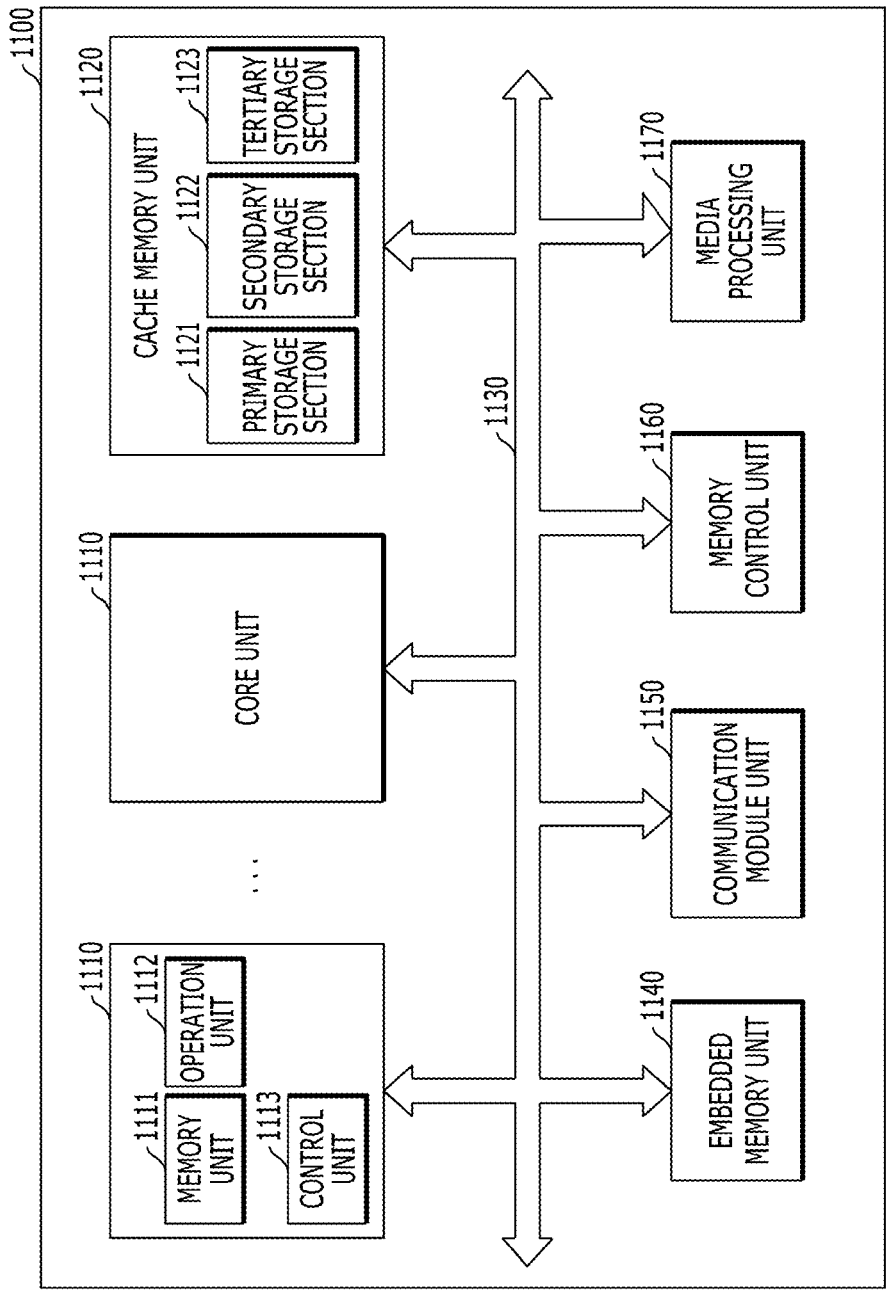
FIG. 20 is a configuration diagram of a processor implementing memory circuitry based on the disclosed technology.

FIG. 20 is a configuration diagram of a processor 1100 implementing memory circuitry based on the disclosed technology.

Referring to FIG. 20, the processor 1100 may improve performance and realize multi-functionality by including various functions in addition to those of the above-described microprocessor 1000. The processor 1100 may include a core unit 1110 which serves as a microprocessor, a cache memory unit 1120 which serves to store data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 of the present embodiment is a part which performs arithmetic logic operations for data inputted from an external device, and may include a memory unit 1111, an operation unit 1112, and a control unit 1113. The memory unit 1111, the operation unit 1112, and the control unit 1113 may be substantially the same as the memory unit 1010, the operation unit 1020, and the control unit 1030 shown in FIG. 19.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 to be used when high storage capacity is required. As the occasion demands, the cache memory unit 1120 may include an increased number of storage sections. That is to say, the number of storage sections included in the cache memory unit 1120 may be changed according to a design. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be largest. At least one storage section of the primary storage section 1121, the secondary storage section 1122, and the tertiary storage section 1123 of the cache memory unit 1120 may include one or more of the above-described semiconductor devices in accordance with the embodiments.

For example, the cache memory unit 1120 may include a substrate including a cell region, a first peripheral circuit region disposed at one side of the cell region in a first direction, and a second peripheral circuit region disposed at one side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; and a first memory cell positioned at each of intersections between the first lines and the second lines in the cell region, wherein the cell region includes a first cell region and a second cell region, the first cell region being disposed closer to the first and second peripheral circuit regions than the second cell region, and wherein a first portion of the second line that is in the first cell region has a greater resistance than a second portion of the second line that is in the second cell region. Through this, operating characteristics of the cache memory unit 1120 may be improved. As a consequence, it is possible to improve operating characteristics of the processor 1100.

Although it was shown in this embodiment that all the primary, secondary, and tertiary storage sections 1121, 1122, and 1123 are configured inside the cache memory unit 1120, at least one of the primary, secondary, and tertiary storage sections 1121, 1122, and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120, and an external device, and allows data to be efficiently transmitted therebetween.

The processor 1100 according to the present embodiment may include a plurality of core units 1110, and the plurality of core units 1110 may share the cache memory unit 1120. The plurality of core units 1110 and the cache memory unit 1120 may be directly connected to each other or be connected to each other through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes data processed in the processor 1100 or data inputted from an external input device and outputs the processed data to an external interface device. Besides, the processor 1100 may include a plurality of modules and devices. In this case, the plurality of modules may exchange data with the core units 1110 and the cache memory unit 1120 through the bus interface 1130.

The embedded memory unit 1140 may include not only a volatile memory but also a nonvolatile memory. The volatile memory may include a DRAM (dynamic random access memory), a mobile DRAM, an SRAM (static random access memory), or the like. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or the like.

The communication module unit 1150 may include a module capable of being connected with a wired network, a module capable of being connected with a wireless network, or both of them. The wired network module may include any of a local region network (LAN), a universal serial bus (USB), an Ethernet, power line communication (PLC), or the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB), or the like.

The memory control unit 1160 is to administrate and process data transmitted between the processor 1100 and an external storage device operating according to a different communication standard from that of the processor 1100. The memory control unit 1160 may include any of various memory controllers which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or data inputted in the form of image, voice, and others from the external input device and, output the processed data to the external interface device. The media processing unit 1170 may include a graphic processing unit (GPU), a digital signal processor (DSP), a high definition audio device (HD audio), a high definition multimedia interface (HDMI) controller, or the like.

Figure 21:
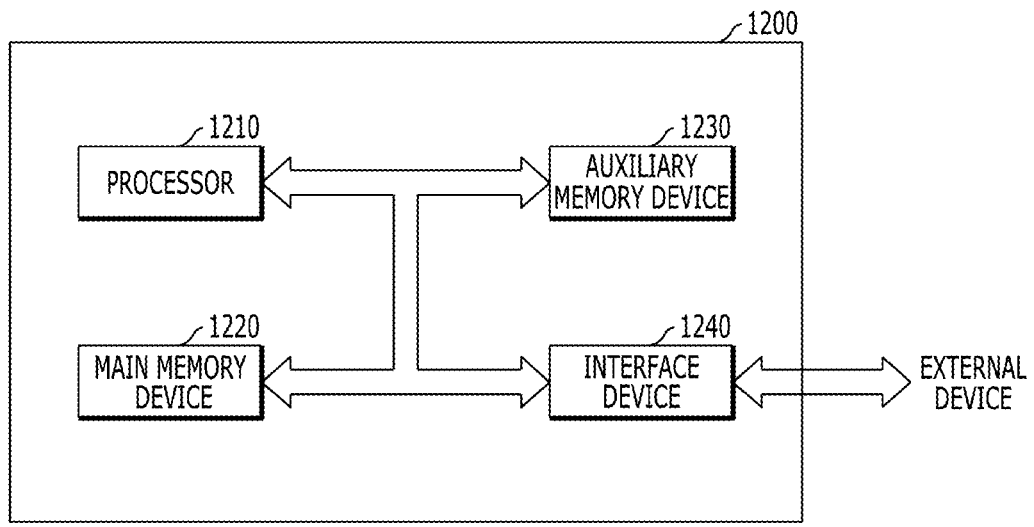
FIG. 21 is a configuration diagram of a system implementing memory circuitry based on the disclosed technology.

FIG. 21 is a configuration diagram of a system 1200 implementing memory circuitry based on the disclosed technology.

Referring to FIG. 21, the system 1200 as an apparatus for processing data may perform inputting, processing, outputting, communication, storage, etc. to conduct a series of manipulations for data. The system 1200 may include at least a processor 1210, a main memory device 1220, an auxiliary memory device 1230, and an interface device 1240. The system 1200 of the present embodiment may be any of various electronic systems, which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for data stored in the system 1200, and controls these operations. The processor 1210 may be substantially the same as the above-described microprocessor 1000 shown in FIG. 19 or the above-described processor 1100 shown in FIG. 20.

The main memory device 1220 is a storage which can temporarily store, call and execute program codes or data from the auxiliary memory device 1230 when programs are executed, and conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a substrate including a cell region, a first peripheral circuit region disposed at one side of the cell region in a first direction, and a second peripheral circuit region disposed at one side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; and a first memory cell positioned at each of intersections between the first lines and the second lines in the cell region, wherein the cell region includes a first cell region and a second cell region, the first cell region being disposed closer to the first and second peripheral circuit regions than the second cell region, and wherein a first portion of the second line that is in the first cell region has a greater resistance than a second portion of the second line that is in the second cell region. Through this, operating characteristics of the main memory device 1220 or the auxiliary memory device 1230 may be improved. As a consequence, it is possible to improve operating characteristics of the system 1200.

Also, the main memory device 1220 or the auxiliary memory device 1230 may include a memory system (see reference numeral 1300 of FIG. 22) in addition to the above-described semiconductor device or without including the above-described semiconductor device.

The interface device 1240 may be to perform exchange of commands and data between the system 1200 and an external device. The interface device 1240 may include one or more of a keypad, a keyboard, a mouse, a speaker, a mike, a display, various human interface devices (HIDs), a communication device, and so on. The communication device may be substantially the same as the above-described communication module unit 1150 shown in FIG. 20.

Figure 22:
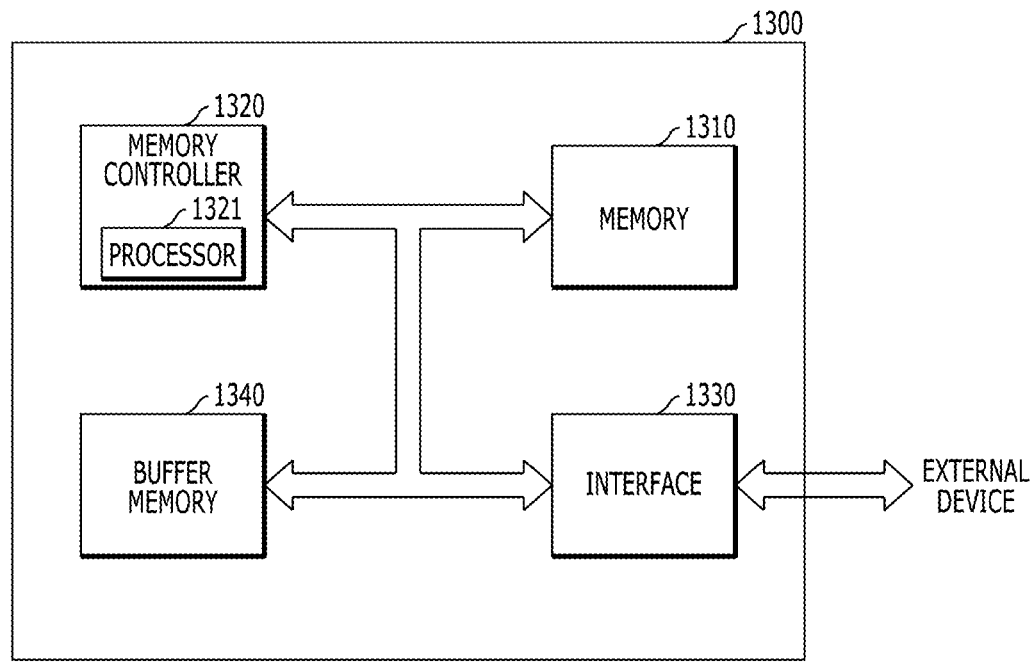
FIG. 22 is a configuration diagram of a memory system implementing memory circuitry based on the disclosed technology.

FIG. 22 is a configuration diagram of a memory system 1300 implementing memory circuitry based on the disclosed technology.

Referring to FIG. 22, the memory system 1300 may include a memory 1310 which has a nonvolatile characteristic as a component for storing data, a controller 1320 which controls the memory 1310, an interface 1330 for connection with an external device, and a buffer memory 1340 for storing data temporarily to efficiently transfer the data between the interface 1330 and the memory 1310. The memory system 1300 may simply mean a memory for storing data, and may also mean a data storage device for conserving stored data in a long term. The memory system 1300 may be a disk type such as a solid state disk (SSD), or a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The memory 1310 or the buffer memory 1340 may include one or more of the above-described semiconductor devices in accordance with the embodiments. For example, the memory 1310 or the buffer memory 1340 may include a substrate including a cell region, a first peripheral circuit region disposed at one side of the cell region in a first direction, and a second peripheral circuit region disposed at one side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; and a first memory cell positioned at each of intersections between the first lines and the second lines in the cell region, wherein the cell region includes a first cell region and a second cell region, the first cell region being disposed closer to the first and second peripheral circuit regions than the second cell region, and wherein a first portion of the second line that is in the first cell region has a greater resistance than a second portion of the second line that is in the second cell region. Through this, operating characteristics of the memory 1310 or the buffer memory 1340 may be improved. As a consequence, it is possible to improve operating characteristics of the memory system 1300.

The memory 1310 or the buffer memory 1340 may include any of various memories, such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for processing commands inputted through the interface 1330 from an outside of the memory system 1300 and so on.

The interface 1330 is to perform exchange of commands and data between the memory system 1300 and the external device. When the memory system 1300 is a card type or a disk type, the interface 1330 may be compatible with interfaces which are used in devices having the card type or the disk type. The interface 1330 may be compatible with one or more interfaces having different types from each other.

Features in the above examples of electronic devices or systems shown in FIGS. 19-22 based on the memory devices disclosed in the present disclosure may be implemented in various devices, systems, or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities, and so on.

While the present disclosure contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in the present disclosure should not be understood as requiring such separation in all embodiments.

Only a few embodiments and examples are described. Other embodiments, enhancements and variations can be made based on what is described and illustrated in the present disclosure.

Although various embodiments have been described for illustrative purposes, it will be apparent to those skilled in the art that various changes and modifications may be made without departing from the spirit and scope of the present teachings as defined in the following claims.

What is claimed is:

1. An electronic device comprising a semiconductor memory, the semiconductor memory comprising:
    a substrate including a cell region, a first peripheral circuit region disposed at one side of the cell region in a first direction, and a second peripheral circuit region disposed at one side of the cell region in a second direction crossing the first direction;
    a plurality of first lines disposed over the substrate and extending in the first direction across the cell region and the first peripheral circuit region;
    a plurality of second lines disposed over the first lines and extending in the second direction across the cell region and the second peripheral circuit region; and
    a first memory cell positioned at each of intersections between the first lines and the second lines in the cell region,
    wherein the cell region includes a first cell region and a second cell region, the first cell region being disposed closer to the first and second peripheral circuit regions than the second cell region, and
    wherein a first portion of the second line that is in the first cell region has a greater resistance than a second portion of the second line that is in the second cell region,
    wherein the first portion of the second line includes a stacked structure of a material layer and a conductive layer,
    wherein the second portion of the second line is a single layer including the conductive layer,
    wherein the conductive layer includes a metal,
    wherein the material layer includes a metal compound, and
    wherein a thickness of the conductive layer in the second portion is equal to a total thickness of the material layer and the conductive layer in the first portion.

2. An electronic device comprising a semiconductor memory, the semiconductor memory comprising:
    a substrate including a cell region, a first peripheral circuit region disposed at one side of the cell region in a first direction, and a second peripheral circuit region disposed at one side of the cell region in a second direction crossing the first direction;
    a plurality of first lines disposed over the substrate and extending in the first direction across the cell region and the first peripheral circuit region;
    a plurality of second lines disposed over the first lines and extending in the second direction across the cell region and the second peripheral circuit region; and
    a first memory cell positioned at each of intersections between the first lines and the second lines in the cell region,
    wherein the cell region includes a first cell region and a second cell region, the first cell region being disposed closer to the first and second peripheral circuit regions than the second cell region,
    wherein a first portion of the second line includes a first conductive layer, and a second portion of the second line includes a second conductive layer, each of the first conductive layer and the second conductive layer being disposed over at least two memory cells,
    wherein a resistance of the first conductive layer is greater than a resistance of the second conductive layer,
    wherein each of the first conductive layer and the second conductive layer is a single layer,
    wherein the first conductive layer and the second conductive layer have a same thickness, and
    wherein the first conductive layer and the second conductive layer are formed of a material containing a same element.

3. The electronic device according to claim 2, wherein a grain boundary of the first conductive layer is greater than a grain boundary of the second conductive layer.

4. An electronic device comprising a semiconductor memory, the semiconductor memory comprising:
    a substrate including a cell region, a first peripheral circuit region disposed at one side of the cell region in a first direction, and a second peripheral circuit region disposed at one side of the cell region in a second direction crossing the first direction;
    a plurality of first lines disposed over the substrate and extending in the first direction across the cell region and the first peripheral circuit region;
    a plurality of second lines disposed over the first lines and extending in the second direction across the cell region and the second peripheral circuit region; and
    a first memory cell positioned at each of intersections between the first lines and the second lines in the cell region,
    wherein the cell region includes a first cell region and a second cell region, the first cell region being disposed closer to the first and second peripheral circuit regions than the second cell region,
    wherein a first portion of the second line includes a stacked structure of a conductive layer and an insulating pattern stacked on the conductive layer,
    wherein a second portion of the second line is a single layer including the conductive layer, and
    wherein a thickness of the conductive layer in the second portion is equal to a total thickness of the conductive layer and the insulating pattern in the first portion.

5. The electronic device according to claim 1, further comprising a microprocessor which includes:
    a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

6. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

7. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

8. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

9. An electronic device comprising a semiconductor memory, the semiconductor memory comprising:

a substrate including a cell region, a first peripheral circuit region disposed at one side of the cell region in a first direction, and a second peripheral circuit region disposed at one side of the cell region in a second direction crossing the first direction;

a plurality of first lines disposed over the substrate and extending in the first direction across the cell region and the first peripheral circuit region;

a plurality of second lines disposed over the first lines and extending in the second direction across the cell region and the second peripheral circuit region;

a first memory cell positioned at each of intersections between the first lines and the second lines in the cell region;

a plurality of third lines disposed over the second lines and respectively overlapping and contacting the second lines;

a plurality of fourth lines disposed over the third lines and respectively overlapping the first lines; and a second memory cell positioned at each of intersections between the third lines and the fourth lines in the cell region, wherein the cell region includes a first cell region and a second cell region, the first cell region being disposed closer to the first and second peripheral circuit regions than the second cell region, and wherein a first portion of the second line that is in the first cell region has a greater resistance than the third line.

10. The electronic device according to claim 9, wherein the first portion of the second line has a greater resistance than a second portion of the second line that is in the second cell region.

11. The electric device of claim 4, wherein:

the conductive layer has a first thickness in the first portion and a second thickness in the second portion, and the first thickness is smaller than the second thickness.

* * * * *